(12) United States Patent
Bellman et al.

(10) Patent No.: US 10,014,177 B2
(45) Date of Patent: *Jul. 3, 2018

(54) METHODS FOR PROCESSING ELECTRONIC DEVICES

(71) Applicant: Corning Incorporated, Corning, NY (US)

(72) Inventors: Robert Alan Bellman, Painted Post, NY (US); Dana Craig Bookbinder, Corning, NY (US); Robert George Manley, Vestal, NY (US); Prantik Mazumder, Ithaca, NY (US); Theresa Chang, Painted Post, NY (US); Jeffrey John Domey, Elmira, NY (US); Darwin Gene Enicks, Corning, NY (US); Vasudha Ravichandran, Painted Post, NY (US); Alan Thomas Stephens, II, Beaver Dams, NY (US); John Christopher Thomas, Elmira, NY (US)

(73) Assignee: Corning Incorporated, Corning, NY (US)

( * ) Notice: Subject to any disclaimer, the term of this patent is extended or adjusted under 35 U.S.C. 154(b) by 116 days.

This patent is subject to a terminal disclaimer.

(21) Appl. No.: 14/047,514

(22) Filed: Oct. 7, 2013

(65) Prior Publication Data
US 2014/0166199 A1      Jun. 19, 2014

Related U.S. Application Data

(60) Provisional application No. 61/736,871, filed on Dec. 13, 2012.

(51) Int. Cl.
| H01L 21/00 | (2006.01) |
| H01L 21/20 | (2006.01) |
| H01L 51/00 | (2006.01) |

(52) U.S. Cl.
CPC ........ *H01L 21/2007* (2013.01); *H01L 51/003* (2013.01); *H01L 51/0097* (2013.01);
(Continued)

(58) Field of Classification Search
CPC ... H01L 2221/68318; H01L 2221/6835; H01L 21/6835; H01L 2251/5338; H01L 21/2007;
(Continued)

(56) References Cited

U.S. PATENT DOCUMENTS

| 3,722,181 A | 3/1973 | Kirkland et al. |
| 4,179,324 A | 12/1979 | Kirkpatrick |

(Continued)

FOREIGN PATENT DOCUMENTS

| CN | 101924067 A | 12/2010 |
| CN | 102070120 B | 9/2012 |

(Continued)

OTHER PUBLICATIONS

ISR from PCT/US2015/012865.
(Continued)

*Primary Examiner* — Scott W Dodds
(74) *Attorney, Agent, or Firm* — Jeffrey A. Schmidt

(57) ABSTRACT

Methods for making electronic devices on thin sheets bonded to carriers. A surface modification layer and associated heat treatments, may be provided on a sheet, a carrier, or both, to control both room-temperature van der Waals (and/or hydrogen) bonding and high temperature covalent bonding between the thin sheet and carrier during the electronic device processing. The room-temperature bonding is controlled so as to be sufficient to hold the thin sheet and carrier together during vacuum processing, wet processing, and/or ultrasonic cleaning processing, during the electronic device processing. And at the same time, the high (Continued)

temperature covalent bonding is controlled so as to prevent a permanent bond between the thin sheet and carrier during high temperature processing, during the electronic device processing, as well as maintain a sufficient bond to prevent delamination during high temperature processing.

23 Claims, 5 Drawing Sheets

(52) U.S. Cl.
CPC .......... H01L 2227/326 (2013.01); H01L 2251/5338 (2013.01); Y02E 10/549 (2013.01); Y10T 156/10 (2015.01); Y10T 156/1052 (2015.01)

(58) Field of Classification Search
CPC ... H01L 51/003; H01L 2227/326; B32B 7/06; B32B 2307/748; B32B 2457/20; B32B 17/10036; B32B 17/10064; B32B 17/10073; G02F 2001/13613
USPC .................... 156/99–107, 247–249
See application file for complete search history.

(56) References Cited

U.S. PATENT DOCUMENTS

| | | |
|---|---|---|
| 4,397,722 A | 8/1983 | Haller |
| 4,599,243 A | 7/1986 | Sachdev et al. |
| 4,822,466 A | 4/1989 | Rabalais et al. |
| 4,849,284 A | 7/1989 | Arthur et al. |
| 4,990,462 A * | 2/1991 | Sliwa, Jr. ............... H01L 23/52 148/DIG. 28 |
| 5,073,181 A | 12/1991 | Foster et al. |
| 5,141,800 A | 8/1992 | Effenberger et al. |
| 5,357,726 A | 10/1994 | Effenberger et al. |
| 5,413,940 A | 5/1995 | Lin et al. |
| 5,479,043 A | 12/1995 | Nuyen |
| 5,482,896 A | 1/1996 | Tang |
| 5,491,571 A * | 2/1996 | Williams ............ G02F 1/13454 257/350 |
| 5,554,680 A | 9/1996 | Ojakaar |
| 5,616,179 A | 4/1997 | Baldwin et al. |
| 5,661,618 A | 8/1997 | Brown et al. |
| 5,820,991 A | 10/1998 | Cabo |
| 5,840,616 A | 11/1998 | Sakaguchi et al. |
| 5,888,591 A | 3/1999 | Gleason et al. |
| 5,904,791 A | 5/1999 | Bearinger et al. |
| 5,966,622 A | 10/1999 | Levine et al. |
| 5,972,152 A | 10/1999 | Lake et al. |
| 6,037,026 A | 3/2000 | Iwamoto |
| 6,091,478 A | 7/2000 | Tanaka et al. |
| 6,124,154 A | 9/2000 | Miyasaka |
| 6,159,385 A | 12/2000 | Yao et al. |
| 6,261,398 B1 | 7/2001 | Costa |
| 6,338,901 B1 | 1/2002 | Veerasamy |
| 6,387,736 B1 | 5/2002 | Cao et al. |
| 6,521,511 B1 | 2/2003 | Inoue et al. |
| 6,521,857 B1 | 2/2003 | Barnett |
| 6,528,145 B1 | 3/2003 | Berger et al. |
| 6,540,866 B1 | 4/2003 | Zhang et al. |
| 6,645,828 B1 | 11/2003 | Farrens et al. |
| 6,687,969 B1 | 2/2004 | Dando |
| 6,699,798 B2 | 3/2004 | Rockford |
| 6,735,982 B2 | 5/2004 | Matthies |
| 6,762,074 B1 | 7/2004 | Draney et al. |
| 6,814,833 B2 | 11/2004 | Sabia |
| 6,815,070 B1 * | 11/2004 | Burkle et al. ............. 428/425.6 |
| 6,974,731 B2 | 12/2005 | Yamazaki et al. |
| 6,992,371 B2 | 1/2006 | Mancini et al. |
| 7,041,608 B2 | 5/2006 | Sieber et al. |
| 7,045,878 B2 | 5/2006 | Faris |
| 7,056,751 B2 | 6/2006 | Faris |
| 7,060,323 B2 | 6/2006 | Sughara et al. |
| 7,147,740 B2 | 12/2006 | Takayama et al. |
| 7,166,520 B1 | 1/2007 | Henley |
| 7,220,656 B2 | 5/2007 | Forbes |
| 7,232,739 B2 | 6/2007 | Kerdiles et al. |
| 7,261,793 B2 | 8/2007 | Chen et al. |
| 7,351,300 B2 * | 4/2008 | Takayama ................ B32B 7/06 156/230 |
| 7,364,942 B2 | 4/2008 | Martin |
| 7,466,390 B2 | 12/2008 | French et al. |
| 7,482,249 B2 | 1/2009 | Jakob et al. |
| 7,574,787 B2 | 8/2009 | Xu et al. |
| 7,635,617 B2 | 12/2009 | Yamazaki |
| 7,737,035 B1 | 6/2010 | Lind et al. |
| 7,842,548 B2 | 11/2010 | Lee et al. |
| 7,902,038 B2 | 3/2011 | Aspar et al. |
| 7,960,840 B2 | 6/2011 | Bonifield et al. |
| 7,978,282 B2 | 7/2011 | An et al. |
| 7,989,314 B2 | 8/2011 | Lee et al. |
| 8,012,667 B2 | 9/2011 | Nam et al. |
| 8,034,206 B2 | 10/2011 | Kim et al. |
| 8,034,452 B2 | 10/2011 | Padiyath et al. |
| 8,048,794 B2 | 11/2011 | Knickerbocker |
| 8,173,249 B2 | 5/2012 | Leu et al. |
| 8,211,259 B2 | 7/2012 | Sato et al. |
| 8,236,669 B2 | 8/2012 | Hong et al. |
| 8,268,939 B2 | 9/2012 | Ebbrecht et al. |
| 8,349,727 B2 | 1/2013 | Guo et al. |
| 8,383,460 B1 | 2/2013 | Yim |
| 8,590,688 B2 | 11/2013 | Weigl |
| 8,609,229 B2 | 12/2013 | Kondo |
| 8,656,735 B2 | 2/2014 | Tamitsuji et al. |
| 8,660,052 B2 | 2/2014 | Liang et al. |
| 8,840,999 B2 | 9/2014 | Harimoto et al. |
| 8,993,706 B2 | 3/2015 | Schubert et al. |
| 9,069,133 B2 | 6/2015 | Baldwin et al. |
| 2002/0171080 A1 | 11/2002 | Faris |
| 2003/0017303 A1 | 1/2003 | Shindo et al. |
| 2003/0020049 A1 | 1/2003 | Payne et al. |
| 2003/0020062 A1 | 1/2003 | Faris |
| 2003/0057563 A1 | 3/2003 | Nathan et al. |
| 2003/0175525 A1 | 9/2003 | Wochnowski et al. |
| 2003/0228413 A1 | 12/2003 | Ohta et al. |
| 2004/0217352 A1 | 11/2004 | Forbes |
| 2004/0222500 A1 | 11/2004 | Aspar et al. |
| 2004/0247949 A1 | 12/2004 | Akedo et al. |
| 2004/0258850 A1 | 12/2004 | Straccia et al. |
| 2005/0001201 A1 | 1/2005 | Bocko et al. |
| 2005/0029224 A1 | 2/2005 | Aspar et al. |
| 2005/0059218 A1 | 3/2005 | Faris |
| 2005/0069713 A1 * | 3/2005 | Gupta ................ H01L 51/0003 428/411.1 |
| 2005/0081993 A1 | 4/2005 | Ilkka et al. |
| 2005/0118742 A1 * | 6/2005 | Henning et al. ............... 438/48 |
| 2005/0175851 A1 | 8/2005 | Bordunov et al. |
| 2005/0224155 A1 | 10/2005 | Chen et al. |
| 2005/0242341 A1 | 11/2005 | Knudson et al. |
| 2006/0134362 A1 | 6/2006 | Lu et al. |
| 2006/0246218 A1 | 11/2006 | Bienkiewicz et al. |
| 2006/0250559 A1 | 11/2006 | Bocko et al. |
| 2006/0264004 A1 | 11/2006 | Tong et al. |
| 2007/0077353 A1 | 4/2007 | Lee et al. |
| 2007/0077728 A1 | 4/2007 | Kulkarni et al. |
| 2007/0077782 A1 | 4/2007 | Lee et al. |
| 2007/0105252 A1 | 5/2007 | Lee et al. |
| 2007/0105339 A1 | 5/2007 | Faris |
| 2007/0111391 A1 * | 5/2007 | Aoki ....................... H01Q 1/38 438/118 |
| 2007/0134784 A1 | 6/2007 | Halverson et al. |
| 2007/0181938 A1 | 8/2007 | Bucher et al. |
| 2008/0044588 A1 | 2/2008 | Sakhrani |
| 2008/0053959 A1 | 3/2008 | Tong et al. |
| 2008/0135175 A1 * | 6/2008 | Higuchi ....................... 156/344 |
| 2008/0173992 A1 | 7/2008 | Mahler et al. |
| 2009/0091025 A1 | 4/2009 | Wong et al. |
| 2009/0110882 A1 | 4/2009 | Higuchi |
| 2009/0126404 A1 | 5/2009 | Sakhrani et al. |
| 2009/0133820 A1 | 5/2009 | Sato et al. |
| 2009/0261062 A1 | 10/2009 | Kim |
| 2009/0262294 A9 | 10/2009 | Templier et al. |
| 2009/0321005 A1 * | 12/2009 | Higuchi et al. ............... 156/249 |

(56) References Cited

U.S. PATENT DOCUMENTS

| | | |
|---|---|---|
| 2010/0038023 A1 | 2/2010 | Kho et al. |
| 2010/0089096 A1 | 4/2010 | Tamitsuji et al. |
| 2010/0101719 A1 | 4/2010 | Otsuka et al. |
| 2010/0187980 A1* | 7/2010 | Langer et al. ............... 313/504 |
| 2010/0224320 A1 | 9/2010 | Tsai et al. |
| 2010/0316871 A1 | 12/2010 | Fujiwara et al. |
| 2011/0001251 A1 | 1/2011 | Gou et al. |
| 2011/0012873 A1 | 1/2011 | Prest et al. |
| 2011/0024166 A1 | 2/2011 | Chang et al. |
| 2011/0026236 A1 | 2/2011 | Kondo et al. |
| 2011/0042649 A1 | 2/2011 | Duvall et al. |
| 2011/0045239 A1* | 2/2011 | Takaya et al. ............... 428/138 |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0102346 A1 | 5/2011 | Orsley et al. |
| 2011/0111194 A1* | 5/2011 | Carre et al. ................. 428/215 |
| 2011/0123787 A1 | 5/2011 | Tomamoto et al. |
| 2011/0256385 A1 | 10/2011 | Matsuzaki et al. |
| 2011/0272090 A1 | 11/2011 | Higuchi |
| 2011/0308739 A1 | 12/2011 | McCutcheon et al. |
| 2011/0311789 A1 | 12/2011 | Loy et al. |
| 2011/0318544 A1 | 12/2011 | Chen et al. |
| 2012/0009703 A1 | 1/2012 | Feinstein et al. |
| 2012/0034437 A1 | 2/2012 | Puligadda et al. |
| 2012/0035309 A1 | 2/2012 | Zhu et al. |
| 2012/0045611 A1 | 2/2012 | Shih et al. |
| 2012/0052654 A1 | 3/2012 | Yang et al. |
| 2012/0061881 A1 | 3/2012 | Bae et al. |
| 2012/0063952 A1 | 3/2012 | Hong et al. |
| 2012/0080403 A1 | 4/2012 | Tomamoto et al. |
| 2012/0083098 A1 | 4/2012 | Berger et al. |
| 2012/0118478 A1 | 5/2012 | Park et al. |
| 2012/0132885 A1 | 5/2012 | Lippert et al. |
| 2012/0153496 A1 | 6/2012 | Lee et al. |
| 2012/0156457 A1 | 6/2012 | Kondo |
| 2012/0156480 A1 | 6/2012 | Kondo et al. |
| 2012/0171454 A1 | 7/2012 | Kondo |
| 2012/0193029 A1 | 8/2012 | Fay et al. |
| 2012/0202010 A1 | 8/2012 | Uchida |
| 2012/0202030 A1 | 8/2012 | Kondo et al. |
| 2012/0228617 A1 | 9/2012 | Ko et al. |
| 2012/0235315 A1 | 9/2012 | Wu et al. |
| 2012/0258320 A1 | 10/2012 | Berger |
| 2012/0272800 A1 | 11/2012 | Lacan et al. |
| 2012/0276689 A1 | 11/2012 | Canale et al. |
| 2013/0037960 A1 | 2/2013 | Sadaka et al. |
| 2013/0192754 A1 | 8/2013 | Dukkipati et al. |
| 2013/0230265 A1 | 9/2013 | Hubbard et al. |
| 2013/0239617 A1 | 9/2013 | Dannoux |
| 2013/0280495 A1 | 10/2013 | Matsumoto |
| 2014/0106141 A1 | 4/2014 | Bellman et al. |
| 2014/0106150 A1 | 4/2014 | Decker et al. |
| 2014/0130969 A1 | 5/2014 | McCutcheon et al. |
| 2014/0150244 A1* | 6/2014 | Liu ...................... B65G 49/061 29/559 |
| 2014/0165654 A1 | 6/2014 | Bellman et al. |
| 2014/0166199 A1 | 6/2014 | Bellman et al. |
| 2014/0170378 A1 | 6/2014 | Bellman et al. |
| 2014/0220327 A1 | 8/2014 | Adib et al. |
| 2014/0295590 A1 | 10/2014 | Oh et al. |
| 2015/0266276 A1 | 9/2015 | Vissing et al. |
| 2016/0329415 A1 | 11/2016 | He et al. |

FOREIGN PATENT DOCUMENTS

| | | | |
|---|---|---|---|
| CN | 101916022 B | | 10/2012 |
| CN | 102820262 A | | 12/2012 |
| CN | 103042803 A | | 4/2013 |
| CN | 102815052 B | | 8/2016 |
| DE | 10323304 | | 4/2004 |
| DE | 10323303 A1 | | 11/2012 |
| EP | 2270865 A2 | | 2/2004 |
| EP | 2270865 A3 | | 2/2004 |
| EP | 1628339 A1 | | 1/2005 |
| EP | 2128105 A1 | | 2/2008 |
| EP | 2128105 | | 2/2009 |
| EP | 20100018505 | | 1/2010 |
| GB | 1373559 A | | 11/1974 |
| GB | 1583544 A | | 7/1976 |
| GB | 2481187 A | | 6/2010 |
| IN | 200906585 | | 4/2012 |
| JP | 1993096235 | | 4/1993 |
| JP | 2000241804 A | | 9/2000 |
| JP | 2002348150 | | 12/2002 |
| JP | 2003077187 A | | 3/2003 |
| JP | 2004178891 A | | 6/2004 |
| JP | 2006003684 | | 1/2006 |
| JP | 2007138144 A | | 6/2007 |
| JP | 4036018 B2 | | 11/2007 |
| JP | 2008072087 A | | 3/2008 |
| JP | 2008123948 A | | 5/2008 |
| JP | 2010018505 A | | 7/2008 |
| JP | 2009028922 A | | 2/2009 |
| JP | 2009028923 A | | 2/2009 |
| JP | 2009184172 A | | 8/2009 |
| JP | 2010167484 A | | 8/2010 |
| JP | 4625913 B2 | | 11/2010 |
| JP | WO 2011048979 A1 * | 4/2011 | ............. B32B 17/06 |
| JP | 2011201976 A | | 10/2011 |
| JP | 2011201977 A | | 10/2011 |
| JP | 2011235532 A | | 11/2011 |
| JP | 2011236349 A | | 11/2011 |
| JP | 5057657 B | | 10/2012 |
| JP | 2012212939 A | | 11/2012 |
| JP | 05111620 B2 | | 1/2013 |
| JP | 2013184346 | | 9/2013 |
| JP | 2013184872 | | 9/2013 |
| JP | 2014019597 | | 2/2014 |
| JP | 2015093405 A | | 5/2015 |
| JP | 2015093795 A | | 5/2015 |
| JP | 2015116694 A | | 6/2015 |
| KR | 10-20080113576 | | 12/2008 |
| KR | 10-20100057521 | | 5/2010 |
| KR | 10-20110045136 | | 5/2011 |
| KR | 10-20110134708 | | 12/2011 |
| KR | 10-20120033284 | | 4/2012 |
| KR | 2012031698 A | | 4/2012 |
| KR | 10-20120056227 | | 6/2012 |
| KR | 20120100274 | | 9/2012 |
| KR | 2013003997 A | | 1/2013 |
| KR | 2013044774 A | | 5/2013 |
| KR | 20130095605 | | 8/2013 |
| WO | 9222604 | | 12/1992 |
| WO | 2005048669 A1 | | 5/2005 |
| WO | 2006093639 A1 | | 9/2006 |
| WO | 2007121524 A | | 11/2007 |
| WO | 2008044884 A1 | | 4/2008 |
| WO | 2010079688 | | 7/2010 |
| WO | 2010098762 A1 | | 9/2010 |
| WO | 2010121524 | | 10/2010 |
| WO | 2011-104500 A1 | | 1/2011 |
| WO | 2011-142280 A1 | | 11/2011 |
| WO | 2012000686 | | 1/2012 |
| WO | 2012057893 | | 5/2012 |
| WO | 2012144499 A1 | | 10/2012 |
| WO | 2013044941 | | 4/2013 |
| WO | 2013058217 | | 4/2013 |
| WO | 2013179881 | | 5/2013 |
| WO | 2013119737 A2 | | 8/2013 |
| WO | 2014093193 | | 6/2014 |
| WO | 2014093740 | | 6/2014 |
| WO | 2014093775 | | 6/2014 |
| WO | 2014093776 | | 6/2014 |
| WO | 2014151353 | | 9/2014 |
| WO | 2015054098 | | 4/2015 |
| WO | 2015057605 | | 4/2015 |
| WO | 2015113020 A1 | | 7/2015 |
| WO | 2015113023 A1 | | 7/2015 |
| WO | 2015119210 A1 | | 8/2015 |
| WO | 2015156395 A1 | | 10/2015 |
| WO | 2015157202 A1 | | 10/2015 |

(56) References Cited

FOREIGN PATENT DOCUMENTS

| WO | 2015163134 A1 | 10/2015 |
|---|---|---|
| WO | 2016017645 A1 | 2/2016 |
| WO | 2016209897 A1 | 12/2016 |

OTHER PUBLICATIONS

ISR from WO2014/151353.
ISR from PCT/US2015/013017.
Iller Chemistry of Sllcia Ch. 6, copyrighted material date 1979; Chapter 6. The Surface of Chemistryof Silica.
Sindorf and Marciel J Phys. Chem. 1982, 86, 5208-5219—Cross-Polarization/Magic-Angle-Spinning Silicon-29 Nuclear Magnetic Resonance Study of Silica Gel Using Trimethylsilane Bonding as a Probe of Surface Geometry and Reactivity.
Elsevier: Zhuravlev SiO2; Colloids and Surfaces A: Physicochemical and Engineering Aspects 173 (2000) 1-38; Institute of Physical Chemistry, Russian Academy of Sciences, Leninsky Prospect 31, Moscow 117915, Russia.
Elsevier: Applied Surface Science 143 _1999. 301-308; The deposition of anti-adhesive ultra-thin teflon-like films and their interaction with polymers during hot embossing.
1994 American Chemical Society; Langmuir 1994,IO, 3887-3897; Dynamic Contact Angles and Contact Angle Hysteresis of Plasma Polymers.
1994 American Chemical Society; Langmuir 1994,10, 2766-2773; Surface Forces between Plasma Polymer Films.
Elsevier: Science Direct; Journal of Non-Crystalline Solids 316(2003) 349-363; Surface chemistry and trimethylsilyl functionalization of St∈ober silica sols T.I. Suratwala *, M.L. Hanna, E.L. Miller, P.K. Whitman, I.M. Thomas, P.R. Ehrmann, R.S. Maxwell, A.K. Burnham Lawrence Livermore National Laboratory, P.O. Box 808, Livermore, CA 94551, USA; received in revised form Mar. 4, 2002.
Deactivation with Silazanes in Chromatography, Mechanism of the Reaction and Practical Consequences in Capillary GC and RP-HPLC: A2'Si CP-MAS NMR Study; L. J. M. van de Ven, G. Rutten, J. A. Rijks, andJ. W. de Haan* Laboratory of Instrumental Analysis, Eindhoven University of Technology, PO Box 513, 5600 MB Eindhoven, The Netherlands.
PCT—International Search Report form 220 for WO 14/093740; dated Mar. 25, 2014.
PCT—International Search Report form 220 for WO 14/093776; dated Mar. 21, 2014.
PCT—International Search Report form 220 for WO 14/093193; dated Mar. 24, 2014.
Polymer Interface and Adhesion, S. Wu, 1982, Marcel Dekker Inc. Chapter 9—Modifications of Polymer Surfaces, pp. 298-321.
Reversible Silicon Wafer Bonding for Surface Protection: Water-Ehanced Debonding, Tong, et al., J. Electrochem. Soc., vol. 139, No. 11, Nov. 1992, The Electrochemical Society, Inc. pp. L101-L102.
Worldwide First Ultra-thin LTPS-TFT LCD by a Glass on Carrier Technology, Chiao, et al., v3, submitted to SID 2015.
ASTM International E595-07, Standard Test Method for Total Mass Loss and Collected Volatile Condensable Materials from Outgassing in a Vacuum Environment (2013).
3M Dyneon High Temperature Perfluoroelastomer PFE 4131TZ—Technical Data.
2006 Gelest Brochure on Thermal Stability of Silanes, p. 14.
2014 Gelest Brochure—Silane Coupling Agents Connecting Across Boundaries.
Chemraz Perfluoroelastomers—Seals that Withstand the Test of Time, Greene Tweed, 2000.
Perlast G67P—Technical Data Sheet, Issue 4, Revision 1, Jan. 2006.
DuPont Kalrez Perfluoroelastomer Parts—Physical Properties and Product Comparisons, Technical Information—Rev. 11, Sep. 2012.
Techniques for the Characterization of Fluoroelastomers, Hiltz and Smith, Defence R&D Canada—Atlantic Technical Memorandum 2009-246, Dec. 2009.
Crosslinking of Fluoroelastomers by "Click" Azide-Nitrile Cycloaddition, Tillet et al. Journal of Polymer Science, Part A: Polymer Chemistry, 2015, 53, pp. 1171-1173.
Trelleborg Sealing Solutions, Isolast perflurorelastomer seals, Edition Nov. 2008.
Preparation and Properties of Plasma-Deposited Films with Surface Energies Varying Over a Wide Range, Haque and Ratner, Journal of Applied Polymer Science, vol. 32, 4369-4381 (1986) John Wiley & Sons.
Surface-Free Energy of Silicon-Based Plasma Polymer Films, Chech et al., Silanes and Other Coupling Agents, vol. 5, Koninklijke Brill NV, Leiden, 2009, pp. 333-348.
ISR from WO2015/057605.
ISR from PCT/US2015/013012.
ISR from WO2015/054098.
ISR from WO2014/093775.
Girifalco and Good, A Theory for the Estimation of Surface and Interfacial Energies, I. Derivation and Application to Interfacial Tension, H. Phys. Chem., vol. 61, Jul. 1957, pp. 904-909.
Wu, Calculation of Interfacial Tension in Polymer Systems, J. Polymer. Sci.: Part C, No. 34, pp. 19-30 (1971).
Biederman, "The properties of films prepared by the rf sputtering of PTFE and plasma polymerization of some freons", Vacuum, vol. 31, No. 7, Jan. 1, 1981, pp. 285-289.
Terlingen, et al., "Plasma Modification of Polymeric Surfaces for Biomedical Applications", Advanced Biomaterials in Biomedical Engineering and Drug Delivery Systems, 1996 Springer Japan, Tokyo, XP002756666, ISBN: 978-4-431-65885-6, p. 38, abstract.
Stoffels et al., "Polymerization of fluorocarbons in reactive ion etching plasma", Journal of Vacuum Science and Technology; Part A, AVS / AIP, Melville, NY, vol. 16, No. 1, Jan. 1, 1998, pp. 87-95. Abstract.
Boscher et al;. "Influence of Cyclic Organosilicon Precursors on the Corrosion of Aluminium Coated Sheet by Atmospheric Pressure Dielectric Barrier Discharge"; Surface and Coatings Technology 205; (2011) 5350-5357.
Haller; "Polymerization of Aromatic Silanes in RF Plasmas"; J. Electrochem Soc.: Solid-State Science and Technology; vol. 129, No. 1; Jan. 1982; pp. 180-183.
International Search Report and Written Opinion of the International Searching Authority; PCT/US2013/073785; dated Mar. 24, 2014; 11 pages; Korean Patent Office.
International Search Report and Written Opinion of the International Searching Authority; PCT/US2013/074859; dated Mar. 25, 2014; 10 pages; Korean Patent Office.
International Search Report and Written Opinion of the International Searching Authority; PCT/US2013/074924; dated Mar. 27, 2014; 14 pages; Korean Patent Office.
International Search Report and Written Opinion of the International Searching Authority; PCT/US2013/074926; dated Mar. 21, 2014; 13 pages; European Patent Office.
International Search Report and Written Opinion of the International Searching Authority; PCT/US2014/059237; dated Mar. 11, 2015; 15 pages; European Patent Office.
International Search Report and Written Opinion of the International Searching Authority; PCT/US2014/060340; dated Jan. 29, 2015; 13 pages; European Patent Office.
International Search Report and Written Opinion of the International Searching Authority; PCT/US2016/038663; dated Sep. 23, 2016; 11 pages; European Patent Office.
International Search Report of the International Searching Authority; PCT/US2016/032843; dated Aug. 10, 2016; 14 pages; European Patent Office.
Kuritka et al; "Mass Spectrometry Characterization of Methylphenylsilane-Hydrogen RF Plasmas"; Plasma Process. Polym. 2007, 4, 53-61.
Merche et al; "Atmospheric Plasmas for Thin Film Deposition: A Critical Review"; Thin Solid Films 520, (2012) 4219-4236.
Nagai et al; "Structure and Morphology of Phenylsilanes Polymer Films Synthesized by the Plasma Polymerization Method"; Journal of Material Science 33, (1998); 1897-1905.

(56) References Cited

OTHER PUBLICATIONS

Nehlsen et al; "Gas Permeation Properties of Plasma Polymerized Thin Film Siloxane-Type Membranes for Temperature Up to 350°C"; Journal of Membrane Science; 106 (1995) 1-7.
Salyk et al; "Plasma Polymerisation of Methylphenylsilane"; Surface & Coatings Technology, 20, (2005) pp. 486-489.
Shieh et al; "Modifications of Low Dielectric Constant Fluorinated Amorphous Carbon Films by Multiple Plasma Treatments"; J. Electro. Soc.; 149 (7) G384-G390 (2002).

* cited by examiner

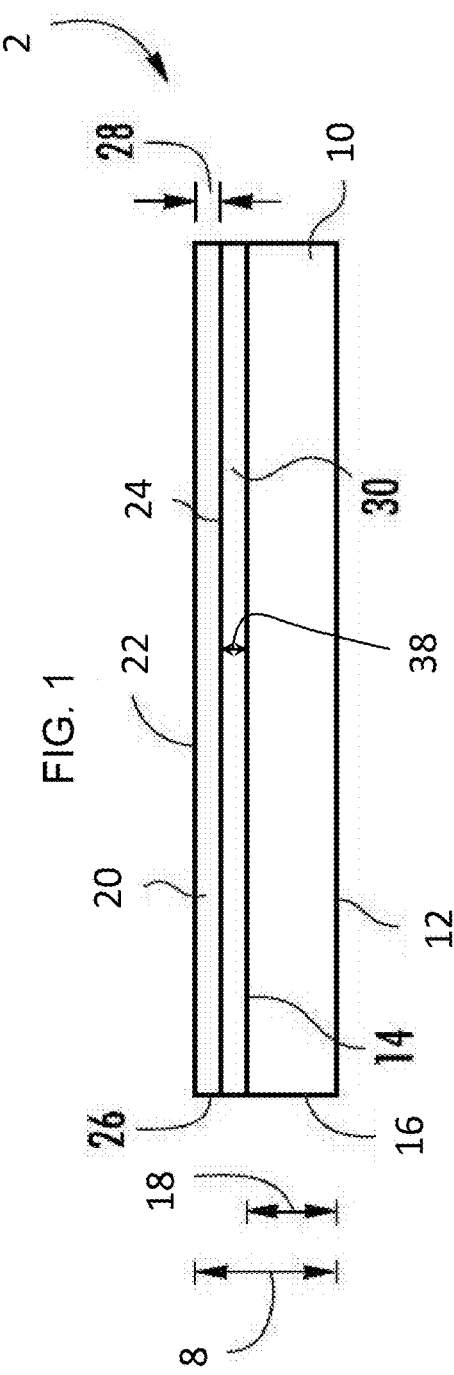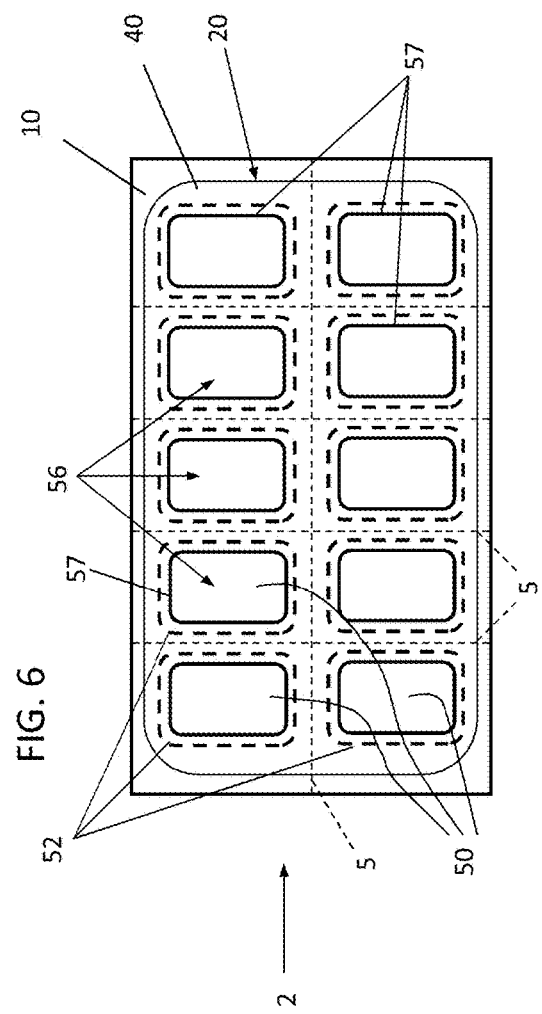

METHODS FOR PROCESSING ELECTRONIC DEVICES

This application claims the benefit of priority under 35 U.S.C. § 119 of U.S. Provisional Application Ser. No. 61/736,871, filed on Dec. 13, 2012, the content of which is relied upon and incorporated herein by reference in its entirety.

BACKGROUND

Field of the Invention

The present invention is directed to articles and methods for processing electronic devices on flexible sheets on carriers and, more particularly to articles and methods for processing electronic devices on flexible glass sheets on glass carriers.

Technical Background

Flexible substrates offer the promise of cheaper devices using roll-to-roll processing, and the potential to make thinner, lighter, more flexible and durable displays. However, the technology, equipment, and processes required for roll-to-roll processing of high quality displays are not yet fully developed. Since panel makers have already heavily invested in toolsets to process large sheets of glass, laminating a flexible substrate to a carrier and making display devices by a sheet-to-sheet processing offers a shorter term solution to develop the value proposition of thinner, lighter, and more flexible displays. Displays have been demonstrated on polymer sheets for example polyethylene naphthalate (PEN) where the device fabrication was sheet to sheet with the PEN laminated to a glass carrier. The upper temperature limit of the PEN limits the device quality and process that can be used. In addition, the high permeability of the polymer substrate leads to environmental degradation of OLED devices where a near hermetic package is required. Thin film encapsulation offers the promise to overcome this limitation, but it has not yet been demonstrated to offer acceptable yields at large volumes.

In a similar manner, display devices can be manufactured using a glass carrier laminated to one or more thin glass substrates. It is anticipated that the low permeability and improved temperature and chemical resistance of the thin glass will enable higher performance longer lifetime flexible displays.

However, the thermal, vacuum, solvent and acidic, and ultrasonic, Flat Panel Display (FPD) processes require a robust bond for thin glass bound to a carrier. FPD processes typically involve vacuum deposition (sputtering metals, transparent conductive oxides and oxide semiconductors, Chemical Vapor Deposition (CVD) deposition of amorphous silicon, silicon nitride, and silicon dioxide, and dry etching of metals and insulators), thermal processes (including ~300-400° C. CVD deposition, up to 600° C. p-Si crystallization, 350-450° C. oxide semiconductor annealing, up to 650° C. dopant annealing, and ~200-350° C. contact annealing), acidic etching (metal etch, oxide semiconductor etch), solvent exposure (stripping photoresist, deposition of polymer encapsulation), and ultrasonic exposure (in solvent stripping of photoresist and aqueous cleaning, typically in alkaline solutions).

Adhesive wafer bonding has been widely used in Micromechanical Systems (MEMS) and semiconductor processing for back end steps where processes are less harsh. Commercial adhesives by Brewer Science and Henkel are typically thick polymer adhesive layers, 5-200 microns thick. The large thickness of these layers creates the potential for large amounts of volatiles, trapped solvents, and adsorbed species to contaminate FPD processes. These materials thermally decompose and outgas above ~250° C. The materials also may cause contamination in downstream steps by acting as a sink for gases, solvents and acids which can outgas in subsequent processes.

U.S. Provisional Application Ser. No. 61/596,727 filed on Feb. 8, 2012, entitled Processing Flexible Glass with a Carrier (hereinafter US '727) discloses that the concepts therein involve bonding a thin sheet, for example, a flexible glass sheet, to a carrier initially by van der Waals forces, then increasing the bond strength in certain regions while retaining the ability to remove portions of the thin sheet after processing the thin sheet/carrier to form devices (for example, electronic or display devices, components of electronic or display devices, organic light emitting device (OLED) materials, photo-voltaic (PV) structures, or thin film transistors), thereon. At least a portion of the thin glass is bonded to a carrier such that there is prevented device process fluids from entering between the thin sheet and carrier, whereby there is reduced the chance of contaminating downstream processes, i.e., the bonded seal portion between the thin sheet and carrier is hermetic, and in some preferred embodiments, this seal encompasses the outside of the article thereby preventing liquid or gas intrusion into or out of any region of the sealed article.

US '727 goes on to disclose that in low temperature polysilicon (LTPS) (low temperature compared to solid phase crystallization processing which can be up to about 750° C.) device fabrication processes, temperatures approaching 600° C. or greater, vacuum, and wet etch environments may be used. These conditions limit the materials that may be used, and place high demands on the carrier/thin sheet. Accordingly, what is desired is a carrier approach that utilizes the existing capital infrastructure of the manufacturers, enables processing of thin glass, i.e., glass having a thickness ≤0.3 mm thick, without contamination or loss of bond strength between the thin glass and carrier at higher processing temperatures, and wherein the thin glass de-bonds easily from the carrier at the end of the process.

One commercial advantage to the approach disclosed in US '727 is that, as noted in US '727, manufacturers will be able to utilize their existing capital investment in processing equipment while gaining the advantages of the thin glass sheets for PV, OLED, LCDs and patterned Thin Film Transistor (TFT) electronics, for example. Additionally, that approach enables process flexibility, including: that for cleaning and surface preparation of the thin glass sheet and carrier to facilitate bonding; that for strengthening the bond between the thin sheet and carrier at the bonded area; that for maintaining releasability of the thin sheet from the carrier at the non-bonded (or reduced/low-strength bond) area; and that for cutting the thin sheets to facilitate extraction from the carrier.

In the glass-to-glass bonding process, the glass surfaces are cleaned to remove all metal, organic and particulate residues, and to leave a mostly silanol terminated surface. The glass surfaces are first brought into intimate contact where van der Waals and/or Hydrogen-bonding forces pull them together. With heat and optionally pressure, the surface silanol groups condense to form strong covalent Si—O—Si bonds across the interface, permanently fusing the glass pieces. Metal, organic and particulate residue will prevent bonding by obscuring the surface preventing the intimate contact required for bonding. A high silanol surface concentration is also required to form a strong bond as the number of bonds per unit area will be determined by the probability of two silanol species on opposing surfaces reacting to condense out water. Zhuravlel has reported the average number of hydroxyls per $nm^2$ for well hydrated silica as 4.6 to 4.9. Zhuravlel, L. T., *The Surface Chemistry of Amorphous Silika, Zhuravlev Model*, Colloids and Surfaces A: Physiochemical Engineering Aspects 173 (2000) 1-38. In US '727, a non-bonding region is formed within a bonded periphery, and the primary manner described for forming such non-bonding area is increasing surface roughness. An average surface roughness of greater than 2 nm Ra can prevent glass to glass bonds forming during the elevated temperature of the bonding process. In U.S. Provisional Application No. 61/736,880, filed on Dec. 13, 2012 by the same inventors and entitled Facilitated Processing for Controlling Bonding Between Sheet and Carrier (hereinafter US '880), a controlled bonding area is formed by controlling the van der Waals and/or hydrogen bonding between a carrier and a thin glass sheet, but a covalent bonding area is still used as well. Thus, although the articles and methods for processing thin sheets with carriers in US '727 and US '880 are able to withstand the harsh environments of FPD processing, undesirably for some applications, reuse of the carrier is prevented by the strong covalent bond between thin glass and glass carrier in the bonding region that is bonded by covalent, for example Si—O—Si, bonding with adhesive force ~1000-2000 $mJ/m^2$, on the order of the fracture strength of the glass. Prying or peeling cannot be used to separate the covalently bonded portion of the thin glass from the carrier and, thus, the entire thin sheet cannot be removed from the carrier. Instead, the non-bonded areas with the devices thereon are scribed and extracted leaving a bonded periphery of the thin glass sheet on the carrier.

SUMMARY

In light of the above, there is a need for a thin sheet-carrier article that can withstand the rigors of the FPD processing, including high temperature processing (without outgassing that would be incompatible with the semiconductor or display making processes in which it will be used), yet allow the entire area of the thin sheet to be removed (either all at once, or in sections) from the carrier so as to allow the reuse of the carrier for processing another thin sheet. The present specification describes ways to control the adhesion between the carrier and thin sheet to create a temporary bond sufficiently strong to survive FPD processing (including LTPS processing) but weak enough to permit debonding of the sheet from the carrier, even after high-temperature processing. Such controlled bonding can be utilized to create an article having a re-usable carrier, or alternately an article having patterned areas of controlled bonding and covalent bonding between a carrier and a sheet. More specifically, the present disclosure provides surface modification layers (including various materials and associated surface heat treatments), that may be provided on the thin sheet, the carrier, or both, to control both room-temperature van der Waals, and/or hydrogen, bonding and high temperature covalent bonding between the thin sheet and carrier. Even more specifically, the room-temperature bonding may be controlled so as to be sufficient to hold the thin sheet and carrier together during vacuum processing, wet processing, and/or ultrasonic cleaning processing. And at the same time, the high temperature covalent bonding may be controlled so as to prevent a permanent bond between the thin sheet and carrier during high temperature processing, as well as maintain a sufficient bond to prevent delamination during high temperature processing. In alternative embodiments, the surface modification layers may be used to create various controlled bonding areas (wherein the carrier and sheet remain sufficiently bonded through various processes, including vacuum processing, wet processing, and/or ultrasonic cleaning processing), together with covalent bonding regions to provide for further processing options, for example, maintaining hermeticity between the carrier and sheet even after dicing the article into smaller pieces for additional device processing. Still further, some surface modification layers provide control of the bonding between the carrier and sheet while, at the same time, reduce outgassing emissions during the harsh conditions in an FPD (for example LTPS) processing environment, including high temperature and/or vacuum processing, for example.

Additional features and advantages will be set forth in the detailed description which follows, and in part will be readily apparent to those skilled in the art from the description or recognized by practicing the various aspects as exemplified in the written description and the appended drawings. It is to be understood that both the foregoing general description and the following detailed description are merely exemplary of the various aspects, and are intended to provide an overview or framework to understanding the nature and character of the invention as it is claimed.

The accompanying drawings are included to provide a further understanding of principles of the invention, and are incorporated in and constitute a part of this specification. The drawings illustrate one or more embodiment(s), and together with the description serve to explain, by way of example, principles and operation of the invention. It is to be understood that various features disclosed in this specification and in the drawings can be used in any and all combinations. By way of non-limiting example the various features may be combined with one another as set forth in the appended claims

BRIEF DESCRIPTION OF THE DRAWINGS

FIG. 1 is a schematic side view of an article having carrier bonded to a thin sheet with a surface modification layer therebetween.

FIG. 6 is a schematic top view of a thin sheet bonded to a carrier by bonding areas.

DETAILED DESCRIPTION

Figure 2:
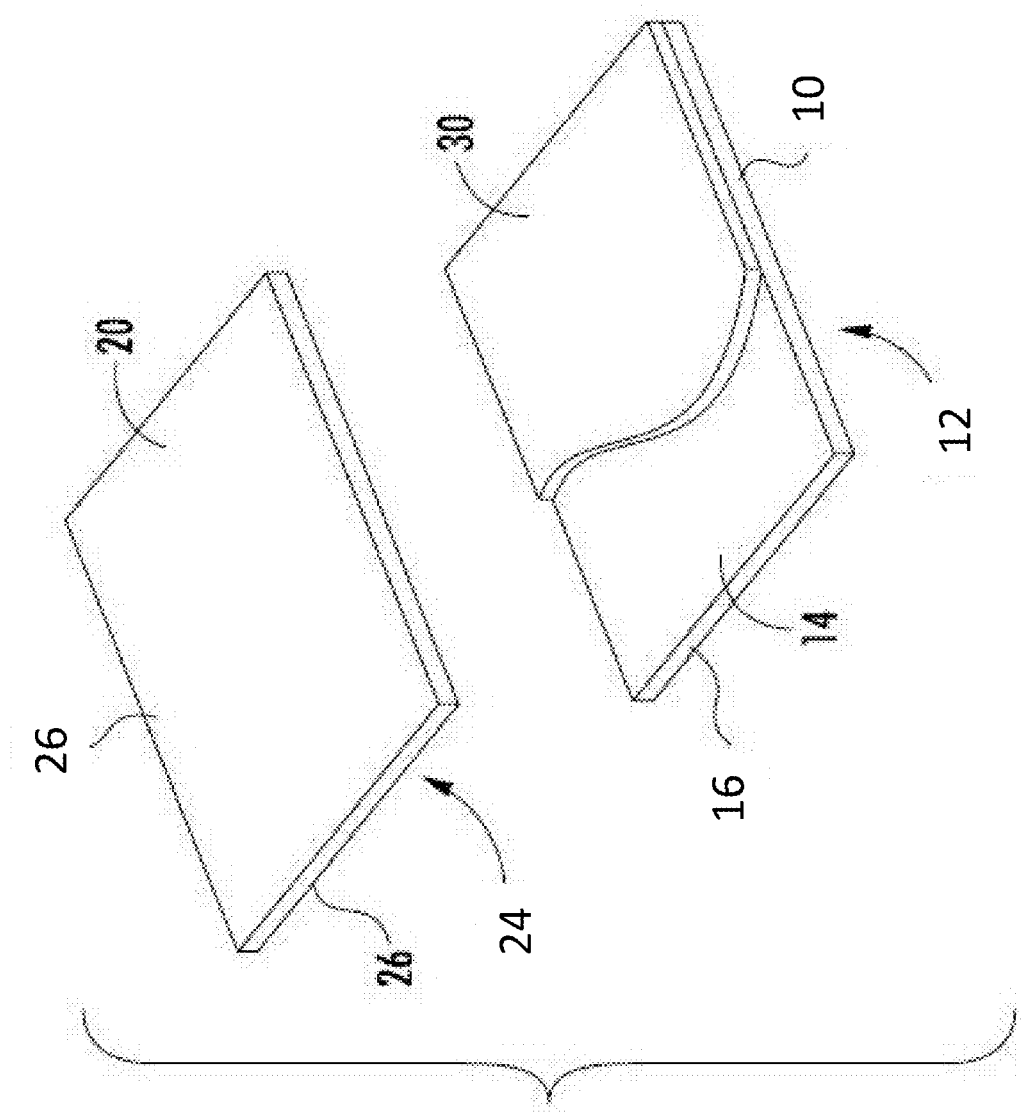
FIG. 2 is an exploded and partially cut-away view of the article in FIG. 1.

In the following detailed description, for purposes of explanation and not limitation, example embodiments disclosing specific details are set forth to provide a thorough understanding of various principles of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of various principles of the present invention. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

As used herein, the singular forms "a," "an" and "the" include plural referents unless the context clearly dictates otherwise. Thus, for example, reference to a "component" includes aspects having two or more such components, unless the context clearly indicates otherwise.

In both US '727, and US '880, there are provided solutions for allowing the processing of a thin glass sheet on a carrier, whereby at least portions of the thin glass sheet remain "non-bonded" so that devices processed on the thin glass sheet may be removed from the carrier. However, the periphery of the thin glass is permanently (or covalently, or hermetically) bonded to the carrier glass through the formation of covalent Si—O—Si bonds. This covalently bonded perimeter prevents reuse of the carrier, as the thin glass cannot be removed in this permanently bonded zone without damaging the thin glass and carrier.

In order to maintain advantageous surface shape characteristics, the carrier is typically a display grade glass substrate. Accordingly, in some situations, it is wasteful and expensive to merely dispose of the carrier after one use. Thus, in order to reduce costs of display manufacture, it is desirable to be able to reuse the carrier to process more than one thin sheet substrate. The present disclosure sets forth articles and methods for enabling a thin sheet to be processed through the harsh environment of the FPD processing lines, including high temperature processing—wherein high temperature processing is processing at a temperature $\geq 400°$ C., and may vary depending upon the type of device being made, for example, temperatures up to about 450° C. as in amorphous silicon or amorphous indium gallium zinc oxide (IGZO) backplane processing, up to about 500-550° C. as in crystalline IGZO processing, or up to about 600-650° C. as is typical in LTPS processes—and yet still allows the thin sheet to be easily removed from the carrier without damage (for example, wherein one of the carrier and the thin sheet breaks or cracks into two or more pieces) to the thin sheet or carrier, whereby the carrier may be reused.

As shown in FIGS. 1 and 2, a glass article 2 has a thickness 8, and includes a carrier 10 having a thickness 18, a thin sheet 20 (i.e., one having a thickness of ≤300 microns, including but not limited to thicknesses of, for example, 10-50 microns, 50-100 microns, 100-150 microns, 150-300 microns, 300, 250, 200 190, 180, 170, 160, 150 140, 130, 120 110 100, 90, 80, 70, 60, 50, 40 30, 20, or 10, microns) having a thickness 28, and a surface modification layer 30 having a thickness 38. The glass article 2 is designed to allow the processing of thin sheet 20 in equipment designed for thicker sheets (i.e., those on the order of ≥0.4 mm, e.g., 0.4 mm, 0.5 mm, 0.6 mm, 0.7 mm, 0.8 mm, 0.9 mm, or 1.0 mm) although the thin sheet 20 itself is ≤300 microns. That is, the thickness 8, which is the sum of thicknesses 18, 28, and 38, is designed to be equivalent to that of the thicker sheet for which a piece of equipment—for example, equipment designed to dispose electronic device components onto substrate sheets—was designed to process. For example, if the processing equipment was designed for a 700 micron sheet, and the thin sheet had a thickness 28 of 300 microns, then thickness 18 would be selected as 400 microns, assuming that thickness 38 is negligible. That is, the surface modification layer 30 is not shown to scale; instead, it is greatly exaggerated for sake of illustration only. Additionally, the surface modification layer is shown in cut-away. In actuality, the surface modification layer would be disposed uniformly over the bonding surface 14 when providing a reusable carrier. Typically, thickness 38 will be on the order of nanometers, for example 0.1 to 2.0, or up to 10 nm, and in some instances may be up to 100 nm. The thickness 38 may be measured by ellipsometer. Additionally, the presence of a surface modification layer may be detected by surface chemistry analysis, for example by ToF Sims mass spectrometry. Accordingly, the contribution of thickness 38 to the article thickness 8 is negligible and may be ignored in the calculation for determining a suitable thickness 18 of carrier 10 for processing a given thin sheet 20 having a thickness 28. However, to the extent that surface modification layer 30 has any significant thickness 38, such may be accounted for in determining the thickness 18 of a carrier 10 for a given thickness 28 of thin sheet 20, and a given thickness for which the processing equipment was designed.

Carrier 10 has a first surface 12, a bonding surface 14, a perimeter 16, and thickness 18. Further, the carrier 10 may be of any suitable material including glass, for example. The carrier need not be glass, but instead can be ceramic, glass-ceramic, or metal (as the surface energy and/or bonding may be controlled in a manner similar to that described below in connection with a glass carrier). If made of glass, carrier 10 may be of any suitable composition including alumino-silicate, boro-silicate, alumino-boro-silicate, soda-lime-silicate, and may be either alkali containing or alkali-free depending upon its ultimate application. Thickness 18 may be from about 0.2 to 3 mm, or greater, for example 0.2, 0.3, 0.4, 0.5, 0.6, 0.65, 0.7, 1.0, 2.0, or 3 mm, or greater, and will depend upon the thickness 28, and thickness 38 when such is non-negligible, as noted above. Additionally, the carrier 10 may be made of one layer, as shown, or multiple layers (including multiple thin sheets) that are bonded together. Further, the carrier may be of a Gen 1 size or larger, for example, Gen 2, Gen 3, Gen 4, Gen 5, Gen 8 or larger (e.g., sheet sizes from 100 mm×100 mm to 3 meters×3 meters or greater).

The thin sheet 20 has a first surface 22, a bonding surface 24, a perimeter 26, and thickness 28. Perimeters 16 and 26 may be of any suitable shape, may be the same as one another, or may be different from one another. Further, the thin sheet 20 may be of any suitable material including glass, ceramic, or glass-ceramic, for example. When made of glass, thin sheet 20 may be of any suitable composition, including alumino-silicate, boro-silicate, alumino-boro-silicate, soda-lime-silicate, and may be either alkali containing or alkali free depending upon its ultimate application. The coefficient of thermal expansion of the thin sheet could be matched relatively closely with that of the carrier to prevent warping of the article during processing at elevated temperatures. The thickness 28 of the thin sheet 20 is 300 microns or less, as noted above. Further, the thin sheet may be of a Gen 1 size or larger, for example, Gen 2, Gen 3, Gen 4, Gen 5, Gen 8 or larger (e.g., sheet sizes from 100 mm×100 mm to 3 meters×3 meters or greater).

Not only does the article 2 need to have the correct thickness to be processed in the existing equipment, it will also need to be able to survive the harsh environment in which the processing takes place. For example, flat panel display (FPD) processing may include wet ultrasonic, vacuum, and high temperature (e.g., ≥400° C.), processing. For some processes, as noted above, the temperature may be ≥500° C., or ≥600° C., and up to 650° C.

In order to survive the harsh environment in which article 2 will be processed, as during FPD manufacture for example, the bonding surface 14 should be bonded to bonding surface 24 with sufficient strength so that the thin sheet 20 does not separate from carrier 10. And this strength should be maintained through the processing so that the thin sheet 20 does not separate from the carrier 10 during processing. Further, to allow the thin sheet 20 to be removed from carrier 10 (so that carrier 10 may be reused), the bonding surface 14 should not be bonded to bonding surface 24 too strongly either by the initially designed bonding force, and/or by a bonding force that results from a modification of the initially designed bonding force as may occur, for example, when the article undergoes processing at high temperatures, e.g., temperatures of ≥400° C. The surface modification layer 30 may be used to control the strength of bonding between bonding surface 14 and bonding surface 24 so as to achieve both of these objectives. The controlled bonding force is achieved by controlling the contributions of van der Waals (and/or hydrogen bonding) and covalent attractive energies to the total adhesion energy which is controlled by modulating the polar and non-polar surface energy components of the thin sheet 20 and the carrier 10. This controlled bonding is strong enough to survive FPD processing (including wet, ultrasonic, vacuum, and thermal processes including temperatures ≥400° C., and in some instances, processing temperatures of ≥500° C., or ≥600° C., and up to 650° C.) and remain de-bondable by application of sufficient separation force and yet by a force that will not cause catastrophic damage to the thin sheet 20 and/or the carrier 10. Such de-bonding permits removal of thin sheet 20 and the devices fabricated thereon, and also allows for re-use of the carrier 10.

Although the surface modification layer 30 is shown as a solid layer between thin sheet 20 and carrier 10, such need not be the case. For example, the layer 30 may be on the order of 0.1 to 2 nm thick, and may not completely cover every bit of the bonding surface 14. For example, the coverage may be ≤100%, from 1% to 100%, from 10% to 100%, from 20% to 90%, or from 50% to 90%. In other embodiments, the layer 30 may be up to 10 nm thick, or in other embodiments even up to 100 nm thick. The surface modification layer 30 may be considered to be disposed between the carrier 10 and thin sheet 20 even though it may not contact one or the other of the carrier 10 and thin sheet 20. In any event, an important aspect of the surface modification layer 30 is that it modifies the ability of the bonding surface 14 to bond with bonding surface 24, thereby controlling the strength of the bond between the carrier 10 and the thin sheet 20. The material and thickness of the surface modification layer 30, as well as the treatment of the bonding surfaces 14, 24 prior to bonding, can be used to control the strength of the bond (energy of adhesion) between carrier 10 and thin sheet 20.

In general, the energy of adhesion between two surfaces is given by ("A theory for the estimation of surface and interfacial energies. I. derivation and application to interfacial tension", L. A. Girifalco and R. J. Good, J. Phys. Chem., V 61, p 904):

$$W = \gamma_1 + \gamma_2 - \gamma_{12} \tag{1}$$

where, $\gamma_1$, $\gamma_2$ and $\gamma_{12}$ are the surface energies of surface 1, surface 2 and the interfacial energy of surface 1 and 2 respectively. The individual surface energies are usually a combination of two terms; a dispersion component $\gamma^d$, and a polar component $\gamma^p$ $$\gamma = \gamma^d + \gamma^p \tag{2}$$

When the adhesion is mostly due to London dispersion forces ($\gamma^d$) and polar forces for example hydrogen bonding ($\gamma^p$), the interfacial energy could be given by (Girifalco and R. J. Good, as mentioned above):

$$\gamma_{12} = \gamma_1 + \gamma_2 - 2\sqrt{\gamma_1^d \gamma_2^d} - 2\sqrt{\gamma_1^p \gamma_2^p} \tag{3}$$

After substituting (3) in (1), the energy of adhesion could be approximately calculated as:

$$W \sim 2[\sqrt{\gamma_1^d \gamma_2^d} + \sqrt{\gamma_1^p \gamma_2^p}] \tag{4}$$

In the above equation (4), only van der Waal (and/or hydrogen bonding) components of adhesion energies are considered. These include polar-polar interaction (Keesom), polar-non polar interaction (Debye) and nonpolar-nonpolar interaction (London). However, other attractive energies may also be present, for example covalent bonding and electrostatic bonding. So, in a more generalized form, the above equation is written as:

$$W \sim 2[\sqrt{\gamma_1^d \gamma_2^d} + \sqrt{\gamma_1^p \gamma_2^p}] + w_c + w_e \tag{5}$$

where $w_c$ and $w_e$ are the covalent and electrostatic adhesion energies. The covalent adhesion energy is rather common, as in silicon wafer bonding where an initially hydrogen bonded pair of wafers are heated to a higher temperature to convert much or all the silanol-silanol hydrogen bonds to Si—O—Si covalent bonds. While the initial, room temperature, hydrogen bonding produces an adhesion energy of the order of ~100-200 mJ/m² which allows separation of the bonded surfaces, a fully covalently bonded wafer pair as achieved during high temperature processing (on the order of 400 to 800° C.) has adhesion energy of ~1000-3000 mJ/m² which does not allow separation of the bonded surfaces; instead, the two wafers act as a monolith. On the other hand, if both the surfaces are perfectly coated with a low surface energy material, for example a fluoropolymer, with thickness large enough to shield the effect of the underlying substrate, the adhesion energy would be that of the coating material, and would be very low leading to low or no adhesion between the bonding surfaces 14, 24, whereby the thin sheet 20 would not be able to be processed on carrier 10. Consider two extreme cases: (a) two standard clean 1 (SC1, as known in the art) cleaned glass surfaces saturated with silanol groups bonded together at room temperature via hydrogen bonding (whereby the adhesion energy is ~100-200 mJ/m²) followed by heating to high temperature which converts the silanol groups to covalent Si—O—Si bonds (whereby the adhesion energy becomes 1000-3000 mJ/m²). This latter adhesion energy is too high for the pair of glass surfaces to be detachable; and (b) two glass surfaces perfectly coated with a fluoropolymer with low surface adhesion energy (~12 mJ/m$^2$ per surface) bonded at room temperature and heated to high temperature. In this latter case (b), not only do the surfaces not bond (because the total adhesion energy of ~24 mJ/m$^2$, when the surfaces are put together, is too low), they do not bond at high temperature either as there are no (or too few) polar reacting groups Between these two extremes, a range of adhesion energies exist, for example between 50-1000 mJ/m$^2$, which can produce the desired degree of controlled bonding. Accordingly, the inventors have found various manners of providing a surface modification layer 30 leading to an adhesion energy that is between these two extremes, and such that there can be produced a controlled bonding that is sufficient enough to maintain a pair of glass substrates (for example a glass carrier 10 and a thin glass sheet 20) bonded to one another through the rigors of FPD processing but also of a degree that (even after high temperature processing of, e.g. ≥400° C.) allows the detachment of the thin sheet 20 from the carrier 10 after processing is complete. Moreover, the detachment of the thin sheet 20 from the carrier 10 can be performed by mechanical forces, and in such a manner that there is no catastrophic damage to at least the thin sheet 20, and preferably also so that there is no catastrophic damage to the carrier 10.

Equation (5) describes that the adhesion energy is a function of four surface energy parameters plus the covalent and electrostatic energy, if any.

An appropriate adhesion energy can be achieved by judicious choice of surface modifiers, i.e., of surface modification layer 30, and/or thermal treatment of the surfaces prior to bonding. The appropriate adhesion energy may be attained by the choice of chemical modifiers of either one or both of bonding surface 14 and bonding surface 24, which in turn control both the van der Waal (and/or hydrogen bonding, as these terms are used interchangeably throughout the specification) adhesion energy as well as the likely covalent bonding adhesion energy resulting from high temperature processing (e.g., on the order of ≥400° C.). For example, taking a bonding surface of SC1 cleaned glass (that is initially saturated with silanol groups with high polar component of surface energy), and coating it with a low energy fluoropolymer provides a control of the fractional coverage of the surface by polar and non-polar groups. This not only offers control of the initial van der Waals (and/or hydrogen) bonding at room temperature, but also provides control of the extent/degree of covalent bonding at higher temperature. Control of the initial van der Waals (and/or hydrogen) bonding at room temperature is performed so as to provide a bond of one surface to the other to allow vacuum and or spin-rinse-dry (SRD) type processing, and in some instances also an easily formed bond of one surface to the other—wherein the easily formed bond can be performed at room temperature without application of externally applied forces over the entire area of the thin sheet 20 as is done in pressing the thin sheet 20 to the carrier 10 with a squeegee, or with a reduced pressure environment. That is, the initial van der Waals bonding provides at least a minimum degree of bonding holding the thin sheet and carrier together so that they do not separate if one is held and the other is allowed to be subjected to the force of gravity. In most cases, the initial van der Walls (and/or hydrogen) bonding will be of such an extent that the article may also go through vacuum, SRD, and ultrasonic processing without the thin sheet delaminating from the carrier. This precise control of both van der Waal (and/or hydrogen bonding) and covalent interactions at appropriate levels via surface modification layer 30 (including the materials from which it is made and/or the surface treatment of the surface to which it is applied), and/or by heat treatment of the bonding surfaces prior to bonding them together, achieves the desired adhesion energy that allows thin sheet 20 to bond with carrier 10 throughout FPD style processing, while at the same time, allowing the thin sheet 20 to be separated (by an appropriate force avoiding damage to the thin sheet 20 and/or carrier) from the carrier 10 after FPD style processing. In addition, in appropriate circumstances, electrostatic charge could be applied to one or both glass surfaces to provide another level of control of the adhesion energy.

FPD processing for example p-Si and oxide TFT fabrication typically involve thermal processes at temperatures above 400° C., above 500° C., and in some instances at or above 600° C., up to 650° C. which would cause glass to glass bonding of a thin glass sheet 20 with a glass carrier 10 in the absence of surface modification layer 30. Therefore controlling the formation of Si—O—Si bonding leads to a reusable carrier. One method of controlling the formation of Si—O—Si bonding at elevated temperature is to reduce the concentration of surface hydroxyls on the surfaces to be bonded.

Figure 3:
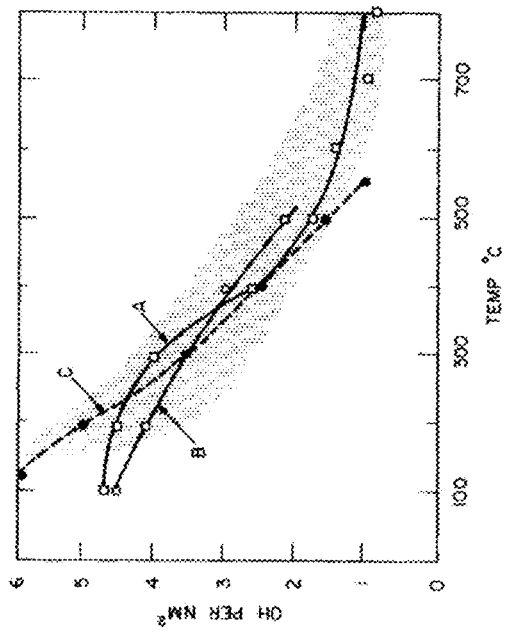
FIG. 3 is a graph of surface hydroxyl concentration on silica as a function of temperature.

As shown in FIG. 3, which is Iler's plot (R. K. Iller: The Chemistry of Silica (Wiley-Interscience, New York, 1979) of surface hydroxyl concentration on silica as a function of temperature, the number of hydroxyls (OH groups) per square nm decreases as the temperature of the surface increases. Thus, heating a silica surface (and by analogy a glass surface, for example bonding surface 14 and/or bonding surface 24) reduces the concentration of surface hydroxyls, decreasing the probability that hydroxyls on two glass surfaces will interact. This reduction of surface hydroxyl concentration in turn reduces the Si—O—Si bonds formed per unit area, lowering the adhesive force. However, eliminating surface hydroxyls requires long annealing times at high temperatures (above 750° C. to completely eliminate surface hydroxyls). Such long annealing times and high annealing temperatures result in an expensive process, and one which is not practical as it is likely to be above the strain point of typical display glass.

From the above analysis, the inventors have found that an article including a thin sheet and a carrier, suitable for FPD processing (including LTPS processing), can be made by balancing the following three concepts:

(1) Modification of the carrier and/or thin sheet bonding surface(s), by controlling initial room temperature bonding, which can be done by controlling van der Waals (and/or hydrogen) bonding, to create a moderate adhesion energy (for example, having a surface energy of >40 mJ/m$^2$ per surface prior to the surfaces being bonded) to facilitate initial room temperature bonding, and sufficient to survive non-high-temperature FPD processes, for example, vacuum processing, SRD processing, and/or ultrasonic processing;

(2) Surface modification of a carrier and/or a thin sheet in a manner that is thermally stable to survive FPD processes without outgassing which can cause delamination and/or unacceptable contamination in the device fabrication, for example, contamination unacceptable to the semiconductor and/or display making processes in which the article may be used; and (3) Controlling bonding at high temperatures, which can be done by controlling the carrier surface hydroxyl concentration, and concentration of other species capable of forming strong covalent bonds at elevated temperatures (e.g., temperature ≥400° C.), whereby there can be controlled the bonding energy between the bonding surfaces of the carrier and the thin sheet such that even after high temperature processing (especially through thermal processes in the range of 500-650° C., as in FPD processes) the adhesive force between the carrier and thin sheet remains within a range that allows debonding of the thin sheet from the carrier with a separation force that does not damage at least the thin sheet (and preferably that does not damage either the thin sheet or the carrier), and yet sufficient enough to maintain the bond between the carrier and thin sheet so that they do not delaminate during processing.

Further, the inventors have found that the use of a surface modification layer 30, together with bonding surface preparation as appropriate, can balance the above concepts so as readily to achieve a controlled bonding area, that is, a bonding area that provides a sufficient room-temperature bond between the thin sheet 20 and carrier 10 to allow the article 2 to be processed in FPD type processes (including vacuum and wet processes), and yet one that controls covalent bonding between the thin sheet 20 and carrier 10 (even at elevated temperatures ≥400° C.) so as to allow the thin sheet 20 to be removed from the carrier 10 (without damage to at least the thin sheet, and preferably without damage to the carrier also) after the article 2 has finished high temperature processing, for example, FPD type processing or LTPS processing. To evaluate potential bonding surface preparations, and surface modification layers, that would provide a reusable carrier suitable for FPD processing, a series of tests were used to evaluate the suitability of each. Different FPD applications have different requirements, but LTPS and Oxide TFT processes appear to be the most stringent at this time and, thus, tests representative of steps in these processes were chosen, as these are desired applications for the article 2. Vacuum processes, wet cleaning (including SRD and ultrasonic type processes) and wet etching are common to many FPD applications. Typical aSi TFT fabrication requires processing up to 320° C. Annealing at 400° C. is used in oxide TFT processes, whereas crystallization and dopant activation steps over 600° C. are used in LTPS processing. Accordingly, the following five tests were used to evaluate the likelihood that a particular bonding surface preparation and surface modification layer 30 would allow a thin sheet 20 to remain bonded to a carrier 10 throughout FPD processing, while allowing the thin sheet 20 to be removed from the carrier 10 (without damaging the thin sheet 20 and/or the carrier 10) after such processing (including processing at temperatures ≥400° C.). The tests were performed in order, and a sample progressed from one test to the next unless there was failure of the type that would not permit the subsequent testing.

(1) Vacuum testing. Vacuum compatibility testing was performed in an STS Multiplex PECVD loadlock (available from SPTS, Newport, UK)—The loadlock was pumped by an Ebara ATOS dry pump with a soft pump valve (available from Ebara Technologies Inc., Sacramento, Calif. A sample was placed in the loadlock, and then the loadlock was pumped from atmospheric pressure down to 70 mTorr in 45 sec. Failure, indicated by a notation of "F" in the "Vacuum" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) movement of the thin sheet relative to the carrier (as determined by visual observation with the naked eye—samples were photographed before and after testing, wherein failure was deemed to have occurred if there was a movement of bond defects, e.g., bubbles, or if edges debonded, or if there was a movement of the thin sheet on the carrier). In the tables below, a notation of "P" in the "Vacuum" column indicates that the sample did not fail as per the foregoing criteria.

(2) Wet process testing. Wet processes compatibility testing was performed using a Semitool model SRD-4705 (available from Applied Materials, Santa Clara, Calif.). The testing consisted of 60 seconds 500 rpm rinse, Q-rinse to 15 MOhm-cm at 500 rpm, 10 seconds purge at 500 rpm, 90 seconds dry at 1800 rpm, and 180 seconds dry at 2400 rpm under warm flowing nitrogen. Failure, as indicated by a notation of "F" in the "SRD" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) movement of the thin sheet relative to the carrier (as determined by visual observation with the naked eye—samples were photographed before and after testing, wherein failure was deemed to have occurred if there was a movement of bond defects, e.g., bubbles, or if edges debonded, or if there was a movement of the thin sheet on the carrier); or (d) penetration of water under the thin sheet (as determined by visual inspection with an optical microscope at 50×, wherein failure was determined to have occurred if liquid or residue was observable). In the tables below, a notation of "P" in the "SRD" column indicates that the sample did not fail as per the foregoing criteria.

(3) Temperature to 400° C. testing. 400° C. process compatibility testing was performed using an Alwin21 Accuthermo610 RTP (available from Alwin21, Santa Clara Calif. A carrier with a thin sheet bonded thereto was heated in a chamber cycled from room temperature to 400° C. at 6.2° C./min, held at 400° C. for 600 seconds, and cooled at 1° C./min to 300° C. The carrier and thin sheet were then allowed to cool to room temperature. Failure, as indicated by a notation of "F" in the "400° C." column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) increased adhesion between the carrier and the thin sheet whereby such increased adhesion prevents debonding (by insertion of a razor blade between the thin sheet and carrier, and/or by sticking a piece of Kapton™ tape, 1" wide×6" long with 2-3" attached to 100 mm square thin glass (K102 series from Saint Gobain Performance Plastic, Hoosik N.Y.) to the thin sheet and pulling on the tape) of the thin sheet from the carrier without damaging the thin sheet or the carrier, wherein a failure was deemed to have occurred if there was damage to the thin sheet or carrier upon attempting to separate them, or if the thin sheet and carrier could not be debonded by performance of either of the debonding methods. Additionally, after the thin sheet was bonded with the carrier, and prior to the thermal cycling, debonding tests were performed on representative samples to determine that a particular material, including any associated surface treatment, did allow for debonding of the thin sheet from the carrier prior to the temperature cycling. In the tables below, a notation of "P" in the "400° C." column indicates that the sample did not fail as per the foregoing criteria.

(4) Temperature to 600° C. testing. 600° C. process compatibility testing was performed using an Alwin21 Accuthermo610 RTP. A carrier with a thin sheet was heated in a chamber cycled from room temperature to 600° C. at 9.5° C./min, held at 600° C. for 600 seconds, and then cooled at 1° C./min to 300° C. The carrier and thin sheet were then allowed to cool to room temperature. Failure, as indicated by a notation of "F" in the "600° C." column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) increased adhesion between the carrier and the thin sheet whereby such increased adhesion prevents debonding (by insertion of a razor blade between the thin sheet and carrier, and/or by sticking a piece of Kapton™ tape as described above to the thin sheet and pulling on the tape) of the thin sheet from the carrier without damaging the thin sheet or the carrier, wherein a failure was deemed to have occurred if there was damage to the thin sheet or carrier upon attempting to separate them, or if the thin sheet and carrier could not be debonded by performance of either of the debonding methods. Additionally, after the thin sheet was bonded with the carrier, and prior to the thermal cycling, debonding tests were performed on representative samples to determine that a particular material, and any associated surface treatment, did allow for debonding of the thin sheet from the carrier prior to the temperature cycling. In the tables below, a notation of "P" in the "600° C." column indicates that the sample did not fail as per the foregoing criteria.

(5) Ultrasonic testing. Ultrasonic compatibility testing was performed by cleaning the article in a four tank line, wherein the article was processed in each of the tanks sequentially from tank #1 to tank #4. Tank dimensions, for each of the four tanks, were 18.4"L×10"W×15"D. Two cleaning tanks (#1 and #2) contained 1% Semiclean KG available from Yokohama Oils and Fats Industry Co Ltd., Yokohama Japan in DI water at 50° C. The cleaning tank #1 was agitated with a NEY prosonik 2 104 kHz ultrasonic generator (available from Blackstone-NEY Ultrasonics, Jamestown, N.Y.), and the cleaning tank #2 was agitated with a NEY prosonik 2 104 kHz ultrasonic generator. Two rinse tanks (tank #3 and tank #4) contained DI water at 50° C. The rinse tank #3 was agitated by NEY sweepsonik 2D 72 kHz ultrasonic generator and the rinse tank #4 was agitated by a NEY sweepsonik 2D 104 kHz ultrasonic generator. The processes were carried out for 10 min in each of the tanks #1-4, followed by spin rinse drying (SRD) after the sample was removed from tank #4. Failure, as indicated by a notation of "F" in the "Ultrasonic" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) formation of other gross defects (as determined by visual inspection with optical microscope at 50×, wherein failure was deemed to have occurred if there were particles trapped between the thin glass and carrier that were not observed before; or (d) penetration of water under the thin sheet (as determined by visual inspection with an optical microscope at 50×, wherein failure was determined to have occurred if liquid or residue was observable. In the tables below, a notation of "P" in the "Ultrasonic" column indicates that the sample did not fail as per the foregoing criteria. Additionally, in the tables below, a blank in the "Ultrasonic" column indicates that the sample was not tested in this manner.

Preparation of Bonding Surfaces Via Hydroxyl Reduction by Heating

The benefit of modifying one or more of the bonding surfaces 14, 24 with a surface modification layer 30 so the article 2 is capable of successfully undergoing FPD processing (i.e., where the thin sheet 20 remains bonded to the carrier 10 during processing, and yet may be separated from the carrier 10 after processing, including high temperature processing) was demonstrated by processing articles 2 having glass carriers 10 and thin glass sheets 20 without a surface modification layer 30 therebetween. Specifically, first there was tried preparation of the bonding surfaces 14, 24 by heating to reduce hydroxyl groups, but without a surface modification layer 30. The carriers 10 and thin sheets 20 were cleaned, the bonding surfaces 14 and 24 were bonded to one another, and then the articles 2 were tested. A typical cleaning process for preparing glass for bonding is the SC1 cleaning process where the glass is cleaned in a dilute hydrogen peroxide and base (commonly ammonium hydroxide, but tetramethylammonium hydroxide solutions for example JT Baker JTB-100 or JTB-111 may also be used). Cleaning removes particles from the bonding surfaces, and makes the surface energy known, i.e., it provides a base-line of surface energy. The manner of cleaning need not be SC1, other types of cleaning may be used, as the type of cleaning is likely to have only a very minor effect on the silanol groups on the surface. The results for various tests are set forth below in Table 1.

A strong but separable initial, room temperature or van der Waal and/or Hydrogen-bond was created by simply cleaning a thin glass sheet of 100 mm square×100 micron thick, and a glass carrier 150 mm diameter single mean flat (SMF) wafer 0.50 or 0.63 mm thick, each comprising Eagle XG® display glass (an alkali-free, alumino-boro-silicate glass, having an average surface roughness Ra on the order of 0.2 nm, available from Corning Incorporated, Corning, N.Y.). In this example, glass was cleaned 10 min in a 65° C. bath of 40:1:2 DI water: JTB-111:Hydrogen peroxide. The thin glass or glass carrier may or may not have been annealed in nitrogen for 10 min at 400° C. to remove residual water—the notation "400° C." in the "Carrier" column or the "Thin Glass" column in Table 1 below indicates that the sample was annealed in nitrogen for 10 minutes at 400° C. FPD process compatibility testing demonstrates this SC1-SC1 initial, room temperature, bond is mechanically strong enough to pass vacuum, SRD and ultrasonic testing. However, heating at 400° C. and above created a permanent bond between the thin glass and carrier, i.e., the thin glass sheet could not be removed from the carrier without damaging either one or both of the thin glass sheet and carrier. And this was the case even for Example 1c, wherein each of the carrier and the thin glass had an annealing step to reduce the concentration of surface hydroxyls. Accordingly, the above-described preparation of the bonding surfaces 14, 24 via heating alone and then bonding of the carrier 10 and the thin sheet 12, without a surface modification layer 30, is not a suitable controlled bond for FPD processes wherein the temperature will be ≥400° C.

TABLE 1 process compatibility testing of SC1-treated glass bonding surfaces

| Example | Carrier | Thin Glass | Vacuum | SRD | 400 C. | 600 C. | Ultrasonic |
|---|---|---|---|---|---|---|---|
| 1a | SC1 | SC1 | P | P | F | F | P |
| 1b | SC1, 400 C. | SC1 | P | P | F | F | P |
| 1c | SC1, 400 C. | SC1, 400 C. | P | P | F | F | P |

Preparation of Bonding Surfaces by Hydroxyl Reduction and Surface Modification Layer Hydroxyl reduction, as by heat treatment for example, and a surface modification layer 30 may be used together to control the interaction of bonding surfaces 14, 24. For example, the bonding energy (both van der Waals and/or Hydrogen-bonding at room temperature due to the polar/dispersion energy components, and covalent bonding at high temperature due to the covalent energy component) of the bonding surfaces 14, 24 can be controlled so as to provide varying bond strength from that wherein room-temperature bonding is difficult, to that allowing easy room-temperature bonding and separation of the bonding surfaces after high temperature processing, to that which—after high temperature processing—prevents the surfaces from separating without damage. In some applications, it may be desirable to have no, or very weak bonding (as when the surfaces are in a "non-bonding" region, as a "non-bonding" region is described in the thin sheet/carrier concept of US '727, and as described below). In other applications, for example providing a re-usable carrier for FPD processes and the like (wherein process temperatures ≥500° C., or ≥600° C., and up to 650° C., may be achieved), it is desirable to have sufficient van der Waals and/or Hydrogen-bonding, at room temperature to initially put the thin sheet and carrier together, and yet prevent or limit high temperature covalent bonding. For still other applications, it may be desirable to have sufficient room temperature boding to initially put the thin sheet and carrier together, and also to develop strong covalent bonding at high temperature (as when the surfaces are in a "bonding region", as "bonding region" is described in the thin sheet/carrier concept of US '727, and as discussed below). Although not wishing to be bound by theory, in some instances the surface modification layer may be used to control room temperature bonding by which the thin sheet and carrier are initially put together, whereas the reduction of hydroxyl groups on the surface (as by heating the surface, or by reaction of the hydroxyl groups with the surface modification layer, for example) may be used to control the covalent bonding, particularly that at high temperatures.

A material for the surface modification layer 30 may provide a bonding surface 14, 24 with an energy (for example, and energy <40 mJ/m$^2$, as measured for one surface, and including polar and dispersion components) whereby the surface produces only weak bonding. In one example, hexamethyldisilazane (HMDS) may be used to create this low energy surface by reacting with the surface hydroxyls to leave a trimethylsilyl (TMS) terminated surface. HMDS as a surface modification layer may be used together with surface heating to reduce the hydroxyl concentration to control both room temperature and high temperature bonding. By choosing a suitable bonding surface preparation for each bonding surface 14, 24, there can be achieved articles having a range of capabilities. More specifically, of interest to providing a reusable carrier for LTPS processing, there can be achieved a suitable bond between a thin glass sheet 20 and a glass carrier 10 so as to survive (or pass) each of the vacuum SRD, 400° C. (parts a and c), and 600° C. (parts a and c), processing tests.

In one example, following SC1 cleaning by HMDS treatment of both thin glass and carrier creates a weakly bonded surface which is challenging to bond at room temperature with van der Waals (and/or hydrogen bonding) forces. Mechanical force is applied to bond the thin glass to the carrier. As shown in example 2a of Table 2, this bonding is sufficiently weak that deflection of the carrier is observed in vacuum testing and SRD processing, bubbling (likely due to outgassing) was observed in 400° C. and 600° C. thermal processes, and particulate defects were observed after ultrasonic processing.

In another example, HMDS treatment of just one surface (carrier in the example cited) creates stronger room temperature adhesion which survives vacuum and SRD processing. However, thermal processes at 400° C. and above permanently bonded the thin glass to the carrier. This is not unexpected as the maximum surface coverage of the trimethylsilyl groups on silica has been calculated by Sindorf and Maciel in J. Phys. Chem. 1982, 86, 5208-5219 to be 2.8/nm$^2$ and measured by Suratwala et. al. in Journal of Non-Crystalline Solids 316 (2003) 349-363 as 2.7/nm$^2$, vs. a hydroxyl concentration of 4.6-4.9/nm$^2$ for fully hydroxylated silica. That is, although the trimethylsilyl groups do bond with some surface hydroxyls, there will remain some un-bonded hydroxyls. Thus one would expect condensation of surface silanol groups to permanently bond the thin glass and carrier given sufficient time and temperature.

Figure 4:
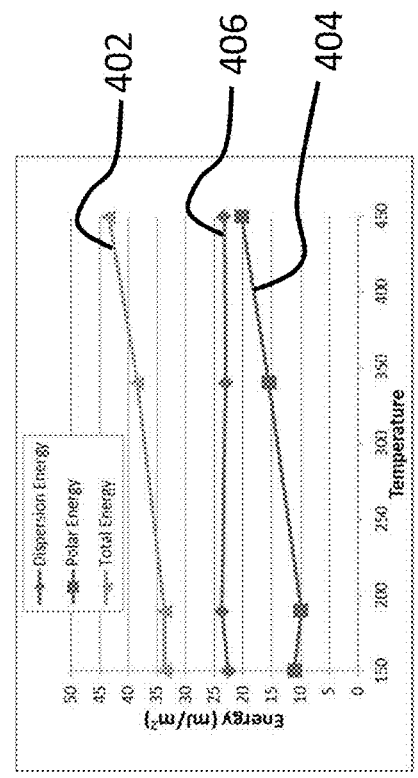
FIG. 4 is a graph of the surface energy of an SC1-cleaned sheet of glass as a function annealing temperature.

A varied surface energy can be created by heating the glass surface to reduce the surface hydroxyl concentration prior to HMDS exposure, leading to an increased polar component of the surface energy. This both decreases the driving force for formation of covalent Si—O—Si bonds at high temperature and leads to stronger room-temperature bonding, for example, van der Waal (and/or hydrogen) bonding. FIG. 4 shows the surface energy of an Eagle XG® display glass carrier after annealing, and after HMDS treatment. Increased annealing temperature prior to HMDS exposure increases the total (polar and dispersion) surface energy (line 402) after HMDS exposure by increasing the polar contribution (line 404). It is also seen that the dispersion contribution (line 406) to the total surface energy remains largely unchanged by the heat treatment. Although not wishing to be bound by theory, increasing the polar component of, and thereby the total, energy in the surface after HMDS treatment appears to be due to there being some exposed glass surface areas even after HMDS treatment because of sub-monolayer TMS coverage by the HMDS.

In example 2b, the thin glass sheet was heated at a temperature of 150° C. in a vacuum for one hour prior to bonding with the non-heat-treated carrier having a coating of HMDS. This heat treatment of the thin glass sheet was not sufficient to prevent permanent bonding of the thin glass sheet to the carrier at temperatures ≥400° C.

As shown in examples 2c-2e of Table 2, varying the annealing temperature of the glass surface prior to HMDS exposure can vary the bonding energy of the glass surface so as to control bonding between the glass carrier and the thin glass sheet.

In example 2c, the carrier was annealed at a temperature of 190° C. in vacuum for 1 hour, followed by HMDS exposure to provide surface modification layer 30. Additionally, the thin glass sheet was annealed at 450° C. in a vacuum for 1 hour before bonding with the carrier. The resulting article survived the vacuum, SRD, and 400° C. tests (parts a and c, but did not pass part b as there was increased bubbling), but failed the 600° C. test. Accordingly, although there was increased resistance to high temperature bonding as compared with example 2b, this was not sufficient to produce an article for processing at temperatures ≥600° C. (for example LTPS processing) wherein the carrier is reusable.

In example 2d, the carrier was annealed at a temperature of 340° C. in a vacuum for 1 hour, followed by HMDS exposure to provide surface modification layer 30. Again, the thin glass sheet was annealed at 450° C. for 1 hour in a vacuum before bonding with the carrier. The results were similar to those for example 2c, wherein the article survived the vacuum, SRD, and 400° C. tests (parts a and c, but did not pass part b as there was increased bubbling), but failed the 600° C. test.

As shown in example 2e, annealing both thin glass and carrier at 450° C. in vacuum for 1 hr, followed by HMDS exposure of the carrier, and then bonding of the carrier and thin glass sheet, improves the temperature resistance to permanent bonding. An anneal of both surfaces to 450° C. prevents permanent bonding after RTP annealing at 600° C. for 10 min, that is, this sample passed the 600° C. processing test (parts a and c, but did not pass part b as there was increased bubbling; a similar result was found for the 400° C. test).

the device fabrication. Also, as indicated in Table 2 by the "SC1" notation, each of the carriers and thin sheets were cleaned using an SC1 process prior to heat treating or any subsequent HMDS treatment.

A comparison of example 2a with example 2b shows that the bonding energy between the thin sheet and the carrier can be controlled by varying the number of surfaces which include a surface modification layer. And controlling the bonding energy can be used to control the bonding force between two bonding surfaces. Also, a comparison of examples 2b-2e, shows that the bonding energy of a surface can be controlled by varying the parameters of a heat treatment to which the bonding surface is subjected before application of a surface modification material. Again, the heat treatment can be used to reduce the number of surface hydroxyls and, thus, control the degree of covalent bonding, especially that at high temperatures.

Other materials, that may act in a different manner to control the surface energy on a bonding surface, may be used for the surface modification layer 30 so as to control the room temperature and high temperature bonding forces between two surfaces. For example, a reusable carrier can also be created if one or both bonding surfaces are modified to create a moderate bonding force with a surface modification layer that either covers, or sterically hinders species for example hydroxyls to prevent the formation at elevated temperature of strong permanent covalent bonds between carrier and thin sheet. One way to create a tunable surface energy, and cover surface hydroxyls to prevent formation of covalent bonds, is deposition of plasma polymer films, for example fluoropolymer films. Plasma polymerization deposits a thin polymer film under atmospheric or reduced pressure and plasma excitation (DC or RF parallel plate, Inductively Coupled Plasma (ICP) Electron Cyclotron Resonance (ECR) downstream microwave or RF plasma) from source gases for example fluorocarbon sources (including CF4, CHF3, C2F6, C3F6, C2F2, CH3F, C4F8, chlorofluoro carbons, or hydrochlorofluoro carbons), hydrocarbons for example alkanes (including methane, ethane, propane, butane), alkenes (including ethylene, propylene), alkynes (including acetylene), and aromatics (including benzene, toluene), hydrogen, and other gas sources for example SF6. Plasma polymerization creates a layer of highly cross-linked

TABLE 2 process compatibility testing of HMDS surface modification layers

| Example | Carrier | Thin Glass | Vacuum | SRD | 400 C. | 600 C. | Ultrasonic |
|---|---|---|---|---|---|---|---|
| 2a | SC1, HMDS | SC1, HMDS | F | F | P | P | F |
| 2b | SC1, HMDS | SC1, 150 C. | P | P | F | F | |
| 2c | SC1, 190 C., HMDS | SC1, 450 C. | P | P | P | F | |
| 2d | SC1, 340 C., HMDS | SC1, 450 C. | P | P | P | F | |
| 2e | SC1, 450 C., HMDS | SC1, 450 C. | P | P | P | P | |

In Examples 2a to 2e above, each of the carrier and the thin sheet were Eagle XG® glass, wherein the carrier was a 150 mm diameter SMF wafer 630 microns thick and the thin sheet was 100 mm square 100 microns thick The HMDS was applied by pulse vapor deposition in a YES-5 HMDS oven (available from Yield Engineering Systems, San Jose Calif.) and was one atomic layer thick (i.e., about 0.2 to 1 nm), although the surface coverage may be less than one monolayer, i.e., some of the surface hydroxyls are not covered by the HMDS as noted by Maciel and discussed above. Because of the small thickness in the surface modification layer, there is little risk of outgassing which can cause contamination in material. Control of reaction conditions and source gases can be used to control the film thickness, density, and chemistry to tailor the functional groups to the desired application.

Figure 5:
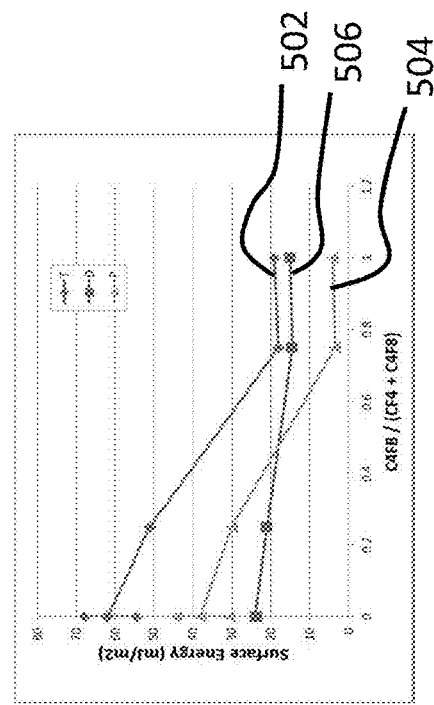
FIG. 5 is a graph of the surface energy of a thin fluoropolymer film deposited on a sheet of glass as a function of the percentage of one of the constituent materials from which the film was made.

FIG. 5 shows the total (line 502) surface energy (including polar (line 504) and dispersion (line 506) components) of plasma polymerized fluoropolymer (PPFP) films deposited from CF4-C4F8 mixtures with an Oxford ICP380 etch tool (available from Oxford Instruments, Oxfordshire UK). The films were deposited onto a sheet of Eagle XG® glass, and spectroscopic ellipsometry showed the films to be 1-10 nm thick. As seen from FIG. 5, glass carriers treated with plasma polymerized fluoropolymer films containing less than 40% C4F8 exhibit a surface energy >40 mJ/m² and produce controlled bonding between the thin glass and carrier at room temperature by van der Waal or hydrogen bonding. Facilitated bonding is observed when initially bonding the carrier and thin glass at room temperature. That is, when placing the thin sheet onto the carrier, and pressing them together at a point, a wave front travels across the carrier, but at a lower speed than is observed for SC1 treated surfaces having no surface modification layer thereon. The controlled bonding is sufficient to withstand all standard FPD processes including vacuum, wet, ultrasonic, and thermal processes up to 600° C., that is this controlled bonding passed the 600° C. processing test without movement or delamination of the thin glass from the carrier. De-bonding was accomplished by peeling with a razor blade and/or Kapton™ tape as described above. The process compatibility of two different PPFP films (deposited as described above) is shown in Table 3. PPFP 1 of example 3a was formed with C4F8/(C4F8+CF4)=0, that is, formed with CF4/H2 and not C4F8, and PPFP 2 of example 3b was deposited with C4F8/(C4F8+CF4)=0.38. Both types of PPFP films survived the vacuum, SRD, 400° C. and 600° C. processing tests. However, delamination is observed after 20 min of ultrasonic cleaning of PPFP 2 indicating insufficient adhesive force to withstand such processing. Nonetheless, the surface modification layer of PPFP2 may be useful for some applications, as where ultrasonic processing is not necessary.

TABLE 3 process compatibility testing of PPFP surface modification layers

| Example | Carrier | Thin Glass | Vacuum | SRD | 400 C. | 600 C. | Ultra-sonic |
|---------|---------|------------|--------|-----|--------|--------|-------------|
| 3a | PPFP 1 | SC1, 150 C. | P | P | P | P | P |
| 3b | PPFP 2 | SC1, 150 C. | P | P | P | P | F |

In Examples 3a and 3b above, each of the carrier and the thin sheet were Eagle XG® glass, wherein the carrier was a 150 mm diameter SMF wafer 630 microns thick and the thin sheet was 100 mm square 100 microns thick. Because of the small thickness in the surface modification layer, there is little risk of outgassing which can cause contamination in the device fabrication. Further, because the surface modification layer did not appear to degrade, again, there is even less risk of outgassing. Also, as indicated in Table 3, each of the thin sheets was cleaned using an SC1 process prior to heat treating at 150° C. for one hour in a vacuum.

Still other materials, that may function in a different manner to control surface energy, may be used as the surface modification layer to control the room temperature and high temperature bonding forces between the thin sheet and the carrier. For example, a bonding surface that can produce controlled bonding can be created by silane treating a glass carrier and/or glass thin sheet. Silanes are chosen so as to produce a suitable surface energy, and so as to have sufficient thermal stability for the application. The carrier or thin glass to be treated may be cleaned by a process for example 02 plasma or UV-ozone, and SC1 or standard clean two (SC2, as is known in the art) cleaning to remove organics and other impurities (metals, for example) that would interfere with the silane reacting with the surface silanol groups. Washes based on other chemistries may also be used, for example, HF, or H2SO4 wash chemistries. The carrier or thin glass may be heated to control the surface hydroxyl concentration prior to silane application (as discussed above in connection with the surface modification layer of HMDS), and/or may be heated after silane application to complete silane condensation with the surface hydroxyls. The concentration of unreacted hydroxyl groups after silanization may be made low enough prior to bonding as to prevent permanent bonding between the thin glass and carrier at temperatures ≥400° C., that is, to form a controlled bond. This approach is described below.

Example 4a

A glass carrier with its bonding surface O2 plasma and SC1 treated was then treated with 1% dodecyltriethoxysilane (DDTS) in toluene, and annealed at 150° C. in vacuum for 1 hr to complete condensation. DDTS treated surfaces exhibit a surface energy of 45 mJ/m². As shown in Table 4, a glass thin sheet (having been SC1 cleaned and heated at 400° C. in a vacuum for one hour) was bonded to the carrier bonding surface having the DDTS surface modification layer thereon. This article survived wet and vacuum process tests but did not survive thermal processes over 400° C. without bubbles forming under the carrier due to thermal decomposition of the silane. This thermal decomposition is expected for all linear alkoxy and chloro alkylsilanes $R1_xSi(OR2)_y(Cl)_z$ where x=1 to 3, and y+z=4−x except for methyl, dimethyl, and trimethyl silane (x=1 to 3, $R1=CH_3$) which produce coatings of good thermal stability.

Example 4b

A glass carrier with its bonding surface O2 plasma and SC1 treated was then treated with 1% 3,3,3, trifluoropropyltritheoxysilane (TFTS) in toluene, and annealed at 150° C. in vacuum for 1 hr to complete condensation. TFTS treated surfaces exhibit a surface energy of 47 mJ/m². As shown in Table 4, a glass thin sheet (having been SC1 cleaned and then heated at 400° C. in a vacuum for one hour) was bonded to the carrier bonding surface having the TFTS surface modification layer thereon. This article survived the vacuum, SRD, and 400° C. process tests without permanent bonding of the glass thin sheet to the glass carrier. However, the 600° C. test produced bubbles forming under the carrier due to thermal decomposition of the silane. This was not unexpected because of the limited thermal stability of the propyl group. Although this sample failed the 600° C. test due to the bubbling, the material and heat treatment of this example may be used for some applications wherein bubbles and the adverse effects thereof, for example reduction in surface flatness, or increased waviness, can be tolerated.

Example 4c

A glass carrier with its bonding surface O2 plasma and SC1 treated was then treated with 1% phenyltriethoxysilane (PTS) in toluene, and annealed at 200° C. in vacuum for 1 hr to complete condensation. PTS treated surfaces exhibit a surface energy of 54 mJ/m². As shown in Table 4, a glass thin sheet (having been SC1 cleaned and then heated at 400° C. in a vacuum for one hour) was bonded to the carrier bonding surface having the PTS surface modification layer. This article survived the vacuum, SRD, and thermal processes up to 600° C. without permanent bonding of the glass thin sheet with the glass carrier.

Example 4d

A glass carrier with its bonding surface O2 plasma and SC1 treated was then treated with 1% diphenyldiethoxysilane (DPDS) in toluene, and annealed at 200° C. in vacuum for 1 hr to complete condensation. DPDS treated surfaces exhibit a surface energy of 47 mJ/m². As shown in Table 4, a glass thin sheet (having been SC1 cleaned and then heated at 400° C. in a vacuum for one hour) was bonded to the carrier bonding surface having the DPDS surface modification layer. This article survived the vacuum and SRD tests, as well as thermal processes up to 600° C. without permanent bonding of the glass thin sheet with the glass carrier

Example 4e

A glass carrier having its bonding surface O2 plasma and SC1 treated was then treated with 1% 4-pentafluorophenyl-triethoxysilane (PFPTS) in toluene, and annealed at 200° C. in vacuum for 1 hr to complete condensation. PFPTS treated surfaces exhibit a surface energy of 57 mJ/m². As shown in Table 4, a glass thin sheet (having been SC1 cleaned and then heated at 400° C. in a vacuum for one hour) was bonded to the carrier bonding surface having the PFPTS surface modification layer. This article survived the vacuum and SRD tests, as well as thermal processes up to 600° C. without permanent bonding of the glass thin sheet with the glass carrier.

TABLE 4 process compatibility testing of silane surface modification layers

| Example | Carrier | Thin Glass | Vacuum | SRD | 400 C. | 600 C. |
|---|---|---|---|---|---|---|
| 4a | SC1, DDTS | SC1, 400 C. | P | P | F | F |
| 4b | SC1, TFTS | SC1, 400 C. | P | P | P | F |
| 4c | SC1, PTS | SC1, 400 C. | P | P | P | P |
| 4d | SC1, DPDS | SC1, 400 C. | P | P | P | P |
| 4e | SC1, PFPTS | SC1, 400 C. | P | P | P | P |

In Examples 4a to 4e above, each of the carrier and the thin sheet were Eagle XG® glass, wherein the carrier was a 150 mm diameter SMF wafer 630 microns thick and the thin sheet was 100 mm square 100 microns thick. The silane layers were self-assembled monolayers (SAM), and thus were on the order of less than about 2 nm thick. In the above examples, the SAM was created using an organosilane with an aryl or alkyl non-polar tail and a mono, di, or tri-alkoxide head group. These react with the silanol surface on the glass to directly attach the organic functionality. Weaker interactions between the non-polar head groups organize the organic layer. Because of the small thickness in the surface modification layer, there is little risk of outgassing which can cause contamination in the device fabrication. Further, because the surface modification layer did not appear to degrade in examples 4c, 4d, and 4e, again, there is even less risk of outgassing. Also, as indicated in Table 4, each of the glass thin sheets was cleaned using an SC1 process prior to heat treating at 400° C. for one hour in a vacuum.

As can be seen from a comparison of examples 4a-4e, controlling surface energy of the bonding surfaces to be above 40 mJ/m² so as to facilitate the initial room temperature bonding is not the only consideration to creating a controlled bond that will withstand FPD processing and still allow the thin sheet to be removed from the carrier without damage. Specifically, as seen from examples 4a-4e, each carrier had a surface energy above 40 mJ/m², which facilitated initial room temperature bonding so that the article survived vacuum and SRD processing. However, examples 4a and 4b did not pass 600° C. processing test. As noted above, for certain applications, it is also important for the bond to survive processing up to high temperatures (for example, ≥400° C., ≥500° C., or ≥600° C., up to 650° C., as appropriate to the processes in which the article is designed to be used) without degradation of the bond to the point where it is insufficient to hold the thin sheet and carrier together, and also to control the covalent bonding that occurs at such high temperatures so that there is no permanent bonding between the thin sheet and the carrier. As shown by the examples in Table 4, aromatic silanes, in particular phenyl silanes, are useful for providing a controlled bond that will facilitate initial room temperature bonding, and that will withstand FPD processing and still allow the thin sheet to be removed from the carrier without damage.

The above-described separation in examples 4, 3, and 2, is performed at room temperature without the addition of any further thermal or chemical energy to modify the bonding interface between the thin sheet and carrier. The only energy input is mechanical pulling and/or peeling force.

The materials described above in examples 3 and 4 can be applied to the carrier, to the thin sheet, or to both the carrier and thin sheet surfaces that will be bonded together.

Uses of Controlled Bonding
Reusable Carrier

One use of controlled bonding via surface modification layers (including materials and the associated bonding surface heat treatment) is to provide reuse of the carrier in an article undergoing processes requiring a temperature ≥600° C., as in LTPS processing, for example. Surface modification layers (including the materials and bonding surface heat treatments), as exemplified by the examples 2e, 3a, 3b, 4c, 4d, and 4e, above, may be used to provide reuse of the carrier under such temperature conditions. Specifically, these surface modification layers may be used to modify the surface energy of the area of overlap between the bonding areas of the thin sheet and carrier, whereby the entire thin sheet may be separated from the carrier after processing. The thin sheet may be separated all at once, or may be separated in sections as, for example, when first removing devices produced on portions of the thin sheet and thereafter removing the remaining portions to clean the carrier for reuse. In the event that the entire thin sheet is removed from the carrier, the carrier can be reused as is by simply by placing another thin sheet thereon. Alternatively, the carrier may be cleaned and once again prepared to carry a thin sheet by forming a surface modification layer anew. Because the surface modification layers prevent permanent bonding of the thin sheet with the carrier, they may be used for processes wherein temperatures are ≥600° C. Of course, although these surface modification layers may control bonding surface energy during processing at temperatures ≥600° C., they may also be used to produce a thin sheet and carrier combination that will withstand processing at lower temperatures, and may be used in such lower temperature applications to control bonding. Moreover, where the thermal processing of the article will not exceed 400° C., surface modification layers as exemplified by the examples 2c, 2d, 4b may also be used in this same manner.

To Provide a Controlled Bonding Area

A second use of controlled bonding via surface modification layers (including materials and the associated bonding surface heat treatments) is to provide a controlled bonding area, between a glass carrier and a glass thin sheet. More specifically, with the use of the surface modification layers an area of controlled bonding can be formed wherein a sufficient separation force can separate the thin sheet portion from the carrier without damage to either the thin sheet or the carrier caused by the bond, yet there is maintained throughout processing a sufficient bonding force to hold the thin sheet relative to the carrier. With reference to FIG. 6, a glass thin sheet 20 may be bonded to a glass carrier 10 by a bonded area 40. In the bonded area 40, the carrier 10 and thin sheet 20 are covalently bonded to one another so that they act as a monolith. Additionally, there are controlled bonding areas 50 having perimeters 52, wherein the carrier 10 and thin sheet 20 are connected, but may be separated from one another, even after high temperature processing, e.g. processing at temperatures ≥600° C. Although ten controlled bonding areas 50 are shown in FIG. 6, any suitable number, including one, may be provided. The surface modification layers 30, including the materials and bonding surface heat treatments, as exemplified by the examples 2a, 2e, 3a, 3b, 4c, 4d, and 4e, above, may be used to provide the controlled bonding areas 50 between the carrier 10 and the thin sheet 20. Specifically, these surface modification layers may be formed within the perimeters 52 of controlled bonding areas 50 either on the carrier 10 or on the thin sheet 20. Accordingly, when the article 2 is processed at high temperature, either to form covalent bonding in the bonding area 40 or during device processing, there can be provided a controlled bond between the carrier 10 and the thin sheet 20 within the areas bounded by perimeters 52 whereby a separation force may separate (without catastrophic damage to the thin sheet or carrier) the thin sheet and carrier in this region, yet the thin sheet and carrier will not delaminate during processing, including ultrasonic processing. The controlled bonding of the present application, as provided by the surface modification layers and any associated heat treatments, is thus able to improve upon the carrier concept in US '727. Specifically, Although the carriers of US '727 were demonstrated to survive FPD processing, including high temperature processing ≥about 600° C. with their bonded peripheries and non-bonded center regions, ultrasonic processes for example wet cleans and resist strip processing remained challenging. Specifically, pressure waves in the solution were seen to induce sympathic vibrations in the thin glass in the non-bonding region (as non-bonding was described in US '727), as there was little or no adhesive force bonding the thin glass and carrier in that region. Standing waves in the thin glass can be formed, wherein these waves may cause vibrations that can lead to breakage of the thin glass at the interface between the bonded and non-bonded regions if the ultrasonic agitation is of sufficient intensity. This problem can be eliminated by minimizing the gap between the thin glass and the carrier and by providing sufficient adhesion, or controlled bonding between the carrier 20 and thin glass 10 in these areas 50. Surface modification layers (including materials and any associated heat treatments as exemplified by examples 2a, 2e, 3a, 3b, 4c, 4d, and 4e) of the bonding surfaces control the bonding energy so as to provide a sufficient bond between the thin sheet 20 and carrier 10 to avoid these unwanted vibrations in the controlled bonding region.

Then, during extraction of the desired parts 56 having perimeters 57, the portions of thin sheet 20 within the perimeters 52 may simply be separated from the carrier 10 after processing and after separation of the thin sheet along perimeters 57. Because the surface modification layers control bonding energy to prevent permanent bonding of the thin sheet with the carrier, they may be used for processes wherein temperatures are ≥600° C. Of course, although these surface modification layers may control bonding surface energy during processing at temperatures ≥600° C., they may also be used to produce a thin sheet and carrier combination that will withstand processing at lower temperatures, and may be used in such lower temperature applications. Moreover, where the thermal processing of the article will not exceed 400° C., surface modification layers as exemplified by the examples 2c, 2d, 4b may also be used—in some instances, depending upon the other process requirements—in this same manner to control bonding surface energy.

To Provide a Bonding Area

A third use of controlled bonding via surface modification layers (including materials and any associated bonding surface heat treatment) is to provide a bonding area between a glass carrier and a glass thin sheet. With reference to FIG. 6, a glass thin sheet 20 may be bonded to a glass carrier 10 by a bonded area 40.

In one embodiment of the third use, the bonded area 40, the carrier 10 and thin sheet 20 may be covalently bonded to one another so that they act as a monolith. Additionally, there are controlled bonding areas 50 having perimeters 52, wherein the carrier 10 and thin sheet 20 are bonded to one another sufficient to withstand processing, and still allow separation of the thin sheet from the carrier even after high temperature processing, e.g. processing at temperatures ≥600° C. Accordingly, surface modification layers 30 (including materials and bonding surface heat treatments) as exemplified by the examples 1a, 1b, 1c, 2b, 2c, 2d, 4a, and 4b above, may be used to provide the bonding areas 40 between the carrier 10 and the thin sheet 20. Specifically, these surface modification layers and heat treatments may be formed outside of the perimeters 52 of controlled bonding areas 50 either on the carrier 10 or on the thin sheet 20. Accordingly, when the article 2 is processed at high temperature, or is treated at high temperature to form covalent bonds, the carrier and the thin sheet 20 will bond to one another within the bonding area 40 outside of the areas bounded by perimeters 52. Then, during extraction of the desired parts 56 having perimeters 57, when it is desired to dice the thin sheet 20 and carrier 10, the article may be separated along lines 5 because these surface modification layers and heat treatments covalently bond the thin sheet 20 with the carrier 10 so they act as a monolith in this area. Because the surface modification layers provide permanent covalent bonding of the thin sheet with the carrier, they may be used for processes wherein temperatures are ≥600° C. Moreover, where the thermal processing of the article, or of the initial formation of the bonding area 40, will be ≥400° C. but less than 600° C., surface modification layers, as exemplified by the materials and heat treatments in example 4a may also be used in this same manner.

In a second embodiment of the third use, in the bonded area 40, the carrier 10 and thin sheet 20 may be bonded to one another by controlled bonding via various surface modification layers described above. Additionally, there are controlled bonding areas 50, having perimeters 52, wherein the carrier 10 and thin sheet 20 are bonded to one another sufficient to withstand processing, and still allow separation of the thin sheet from the carrier even after high temperature processing, e.g. processing at temperatures ≥600° C.

Accordingly, if processing will be performed at temperatures up to 600° C., and it is desired not to have a permanent or covalent bond in area 40, surface modification layers 30 (including materials and bonding surface heat treatments) as exemplified by the examples 2e, 3a, 3b, 4c, 4d, and 4e above, may be used to provide the bonding areas 40 between the carrier 10 and the thin sheet 20. Specifically, these surface modification layers and heat treatments may be formed outside of the perimeters 52 of controlled bonding areas 50, and may be formed either on the carrier 10 or on the thin sheet 20. The controlled bonding areas 50 may be formed with the same, or with a different, surface modification layer as was formed in the bonding area 40. Alternatively, if processing will be performed at temperatures only up to 400° C., and it is desired not to have a permanent or covalent bond in area 40, surface modification layers 30 (including materials and bonding surface heat treatments) as exemplified by the examples 2c, 2d, 2e, 3a, 3b, 4b, 4c, 4d, 4e, above, may be used to provide the bonding areas 40 between the carrier 10 and the thin sheet 20.

Instead of controlled bonding in areas 50, there may be non-bonding regions in areas 50, wherein the non-bonding regions may be areas of increased surface roughness as described in US '727, or may be provided by surface modification layers as exemplified by example 2a.

For Making Electronic Devices

A fifth use of the controlled bonding as described herein is to make glass articles—including those having a carrier and a thin sheet bonded thereto—which are, in turn, used to make electronic devices, for example, TFTs, OLEDs (including an organic light emitting material), PV devices, touch sensors, and displays. A re-usable carrier, as described above for example, may be used. Alternatively, a glass article having bonded and controlled bonding areas, as described above for example, may be used.

In any event, electronic device processing equipment as is currently designed for thicker sheets may be used to process the glass article so as to dispose an electronic-device component, or part of the electronic device, onto the sheet of the article. The electronic device component should be disposed on the portion(s) of the thin sheet that are bonded to the carrier via the controlled bonding described above, whereby the thin sheet remains separable from the carrier even after processing to the temperatures necessary to make the electronic device. The device processing may include processing at temperatures of ≥400° C., ≥500° C., ≥600° C., or up to 650° C., for example. As described above, suitable surface modification layers may be chosen so that the thin sheet remains removable from the carrier—even after processing to such temperatures—without damage to at least the thin sheet, and preferably without damage to both the thin sheet and the carrier. Any number of electronic-device components may be disposed in any number of steps for doing so, until the electronic device is complete or at a suitable intermediate stage. The article may be assembled before the electronic device processing, or may be assembled as a part of the electronic device making process.

The device processing may include keeping the article intact throughout the entire device processing, or may include dicing the article at one or more points in the process. For example, the device processing may include forming one electronic-device component on the article, and then dicing the article into two or more portions that are then subject to further processing, i.e., disposing an additional component of the electronic device onto the sheet or onto the electronic-device component existing on the sheet from disposition in a prior step. The dicing step may be done so that each portion of the article includes a portion of the thin sheet that remains bonded to the carrier, or so that only a subset of the diced portions include such an arrangement. Within any of the diced portions, the entire area of the thin sheet in that portion may remain bonded to the entire area of the carrier in that portion.

After the device processing, either to completion or to an intermediate stage, the device and the portion of the thin sheet on which it is disposed, may be removed from the carrier. The thin sheet may be removed in its entirety, or a portion thereof may be separated from a remaining portion and that portion removed from the carrier. The removal may take place from the article in its entirety, or from one or more of the portions diced therefrom.

Outgassing

Polymer adhesives used in typical wafer bonding applications are generally 10-100 microns thick and lose about 5% of their mass at or near their temperature limit. For such materials, evolved from thick polymer films, it is easy to quantify the amount of mass loss, or outgassing, by mass-spectrometry. On the other hand, it is more challenging to measure the outgassing from thin surface treatments that are on the order of 10 nm thick or less, for example the plasma polymer or self-assembled monolayer surface modification layers described above, as well as for a thin layer of pyrolyzed silicone oil. For such materials, mass-spectrometry is not sensitive enough. There are a number of other ways to measure outgassing, however.

Figure 7:
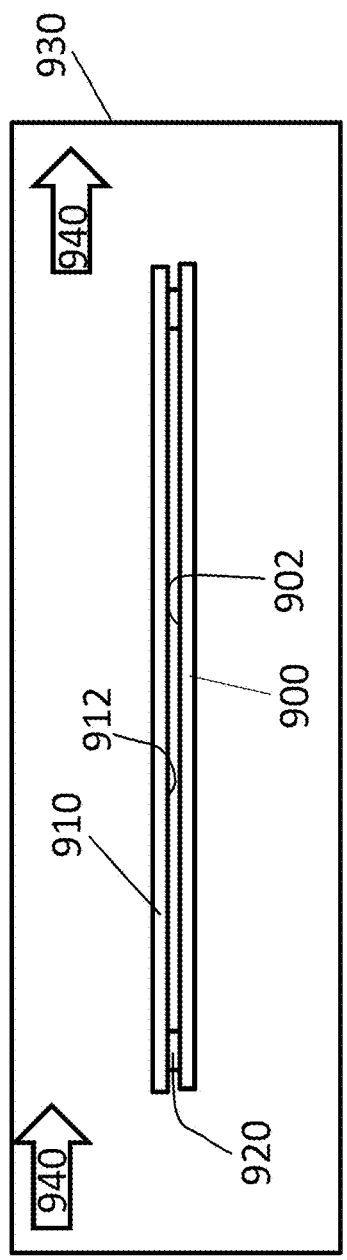
FIG. 7 is a schematic view of a testing setup

A first manner of measuring small amounts of outgassing is based on surface energy measurements, and will be described with reference to FIG. 7. To carry out this test, a setup as shown in FIG. 7 may be used. A first substrate, or carrier, 900 having the to-be-tested surface modification layer thereon presents a surface 902, i.e., a surface modification layer corresponding in composition and thickness to the surface modification layer 30 to be tested. A second substrate, or cover, 910 is placed so that its surface 912 is in close proximity to the surface 902 of the carrier 900, but not in contact therewith. The surface 912 is an uncoated surface, i.e., a surface of bare material from which the cover is made. Spacers 920 are placed at various points between the carrier 900 and cover 910 to hold them in spaced relation from one another. The spacers 920 should be thick enough to separate the cover 910 from the carrier 900 to allow a movement of material from one to the other, but thin enough so that during testing the amount of contamination from the chamber atmosphere on the surfaces 902 and 912 is minimized. The carrier 900, spacers 920, and cover 910, together form a test article 901.

Figure 8:
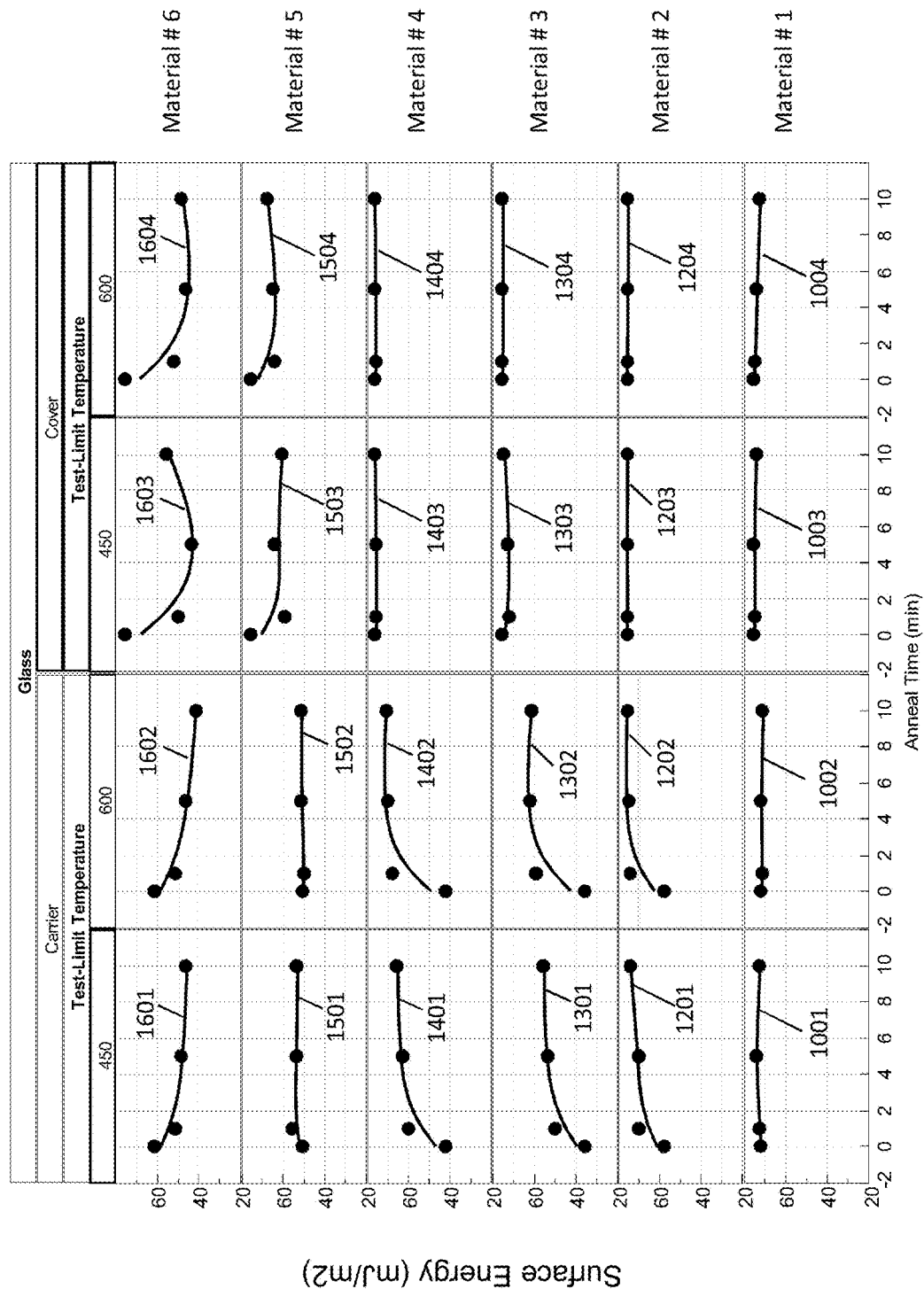
FIG. 8 is a collection of graphs of surface energy (of different parts of the test setup of FIG. 7) versus time for a variety of materials under different conditions.

Prior to assembly of the test article 901, the surface energy of bare surface 912 is measured, as is the surface energy of the surface 902, i.e., the surface of carrier 900 having the surface modification layer provided thereon. The surface energies as shown in FIG. 8, both polar and dispersion components, were measured by fitting a theoretical model developed by S. Wu (1971) to three contact angles of three test liquids; water, diiodomethane and hexadecane. (Reference: S. Wu, J. Polym. Sci. C, 34, 19, 1971).

After assembly, the test article 901 is placed into a heating chamber 930, and is heated through a time-temperature cycle. The heating is performed at atmospheric pressure and under flowing N2 gas, i.e., flowing in the direction of arrows 940 at a rate of 2 standard liters per minute.

During the heating cycle, changes in the surface 902 (including changes to the surface modification layer due to evaporation, pyrolysis, decomposition, polymerization, reaction with the carrier, and de-wetting, for example) are evidenced by a change in the surface energy of surface 902. A change in the surface energy of surface 902 by itself does not necessarily mean that the surface modification layer has outgassed, but does indicate a general instability of the material at that temperature as its character is changing due to the mechanisms noted above, for example. Thus, the less the change in surface energy of surface 902, the more stable the surface modification layer. On the other hand, because of the close proximity of the surface 912 to the surface 902, any material outgassed from surface 902 will be collected on surface 912 and will change the surface energy of surface 912. Accordingly, the change in surface energy of surface 912 is a proxy for outgassing of the surface modification layer present on surface 902.

Thus, one test for outgassing uses the change in surface energy of the cover surface 912. Specifically, if there is a change in surface energy—of surface 912—of ≥10 mJ/m2, then there is outgassing. Changes in surface energy of this magnitude are consistent with contamination which can lead to loss of film adhesion or degradation in material properties and device performance. A change in surface energy of ≤5 mJ/m2 is close to the repeatability of surface energy measurements and inhomogeneity of the surface energy. This small change is consistent with minimal outgassing.

During testing that produced the results in FIG. 8, the carrier 900, the cover 910, and the spacers 920, were made of Eagle XG glass, an alkali-free alumino-boro-silicate display-grade glass available from Corning Incorporated, Corning, N.Y., although such need not be the case. The carrier 900 and cover 910 were 150 mm diameter 0.63 mm thick. Generally, the carrier 910 and cover 920 will be made of the same material as carrier 10 and thin sheet 20, respectively, for which an outgassing test is desired. During this testing, silicon spacers 0.63 mm thick, 2 mm wide, and 8 cm long, thereby forming a gap of 0.63 mm between surfaces 902 and 912. During this testing, the chamber 930 was incorporated in MPT-RTP600s rapid thermal processing equipment that was cycled from room temperature to the test limit temperature at a rate of 9.2° C. per minute, held at the test limit temperature for varying times as shown in the graphs as "Anneal Time", and then cooled at furnace rate to 200° C. After the oven had cooled to 200° C., the test article was removed, and after the test article had cooled to room temperature, the surface energies of each surface 902 and 912 were again measured. Thus, by way of example, using the data for the change in cover surface energy, tested to a limit temperature of 450° C., for Material #1, line 1003, the data was collected as follows. The data point at 0 minutes shows a surface energy of 75 mJ/m2 (milli-Joules per square meter), and is the surface energy of the bare glass, i.e., there has been no time-temperature cycle yet run. The data point at one minute indicates the surface energy as measured after a time-temperature cycle performed as follows: the article 901 (having Material #1 used as a surface modification layer on the carrier 900 to present surface 902) was placed in a heating chamber 930 at room temperature, and atmospheric pressure; the chamber was heated to the test-limit temperature of 450° C. at a rate of 9.2° C. per minute, with a N2 gas flow at two standard liters per minute, and held at the test-limit temperature of 450° C. for 1 minute; the chamber was then allowed to cool to 300° C. at a rate of 1° C. per minute, and the article 901 was then removed from the chamber 930; the article was then allowed to cool to room temperature (without N2 flowing atmosphere); the surface energy of surface 912 was then measured and plotted as the point for 1 minute on line 1003. The remaining data points for Material #1 (lines 1003, 1004), as well as the data points for Material #2 (lines 1203, 1204), Material #3 (lines 1303, 1304), Material #4 (lines 1403, 1404), Material #5 (lines 1503, 1504), and Material #6 (lines 1603, and 1604), were then determined in a similar manner with the minutes of anneal time corresponding to the hold time at the test-limit temperature, either 450° C., or 600° C., as appropriate. The data points for lines 1001, 1002, 1201, 1202, 1301, 1302, 1401, 1402, 1501, 1502, 1601, and 1602, representing surface energy of surface 902 for the corresponding surface modification layer materials (Materials #1-6) were determined in a similar manner, except that the surface energy of the surface 902 was measured after each time-temperature cycle.

The above assembly process, and time-temperature cycling, were carried out for six different materials as set forth below, and the results are graphed in FIG. 8. Of the six materials, Materials #1-4 correspond to surface modification layer materials described above. Materials #5 and #6 are comparative examples.

Material #1 is a CHF3-CF4 plasma polymerized fluoropolymer. This material is consistent with the surface modification layer in example 3b, above. As shown in FIG. 8, lines 1001 and 1002 show that the surface energy of the carrier did not significantly change. Thus, this material is very stable at temperatures from 450° C. to 600° C. Additionally, as shown by the lines 1003 and 1004, the surface energy of the cover did not significantly change either, i.e., the change is ≤5 mJ/m2. Accordingly, there was no outgassing associated with this material from 450° C. to 600° C.

Material #2 is a phenylsilane, a self-assembled monolayer (SAM) deposited form 1% toluene solution of phenyltriethoxysilane and cured in vacuum oven 30 minutes at 190° C. This material is consistent with the surface modification layer in example 4c, above. As shown in FIG. 8, lines 1201 and 1202 indicate some change in surface energy on the carrier. As noted above, this indicates some change in the surface modification layer, and comparatively, Material #2 is somewhat less stable than Material #1. However, as noted by lines 1203 and 1204, the change in surface energy of the carrier is ≤5 mJ/m2, showing that the changes to the surface modification layer did not result in outgassing.

Material #3 is a pentafluorophenylsilane, a SAM deposited from 1% toluene solution of pentafluorophenyltriethoxysilane and cured in vacuum oven 30 minutes at 190° C. This material is consistent with the surface modification layer in example 4e, above. As shown in FIG. 8, lines 1301 and 1302 indicate some change in surface energy on the carrier. As noted above, this indicates some change in the surface modification layer, and comparatively, Material #3 is somewhat less stable than Material #1. However, as noted by lines 1303 and 1304, the change in surface energy of the carrier is ≤5 mJ/m2, showing that the changes to the surface modification layer did not result in outgassing.

Material #4 is hexamethyldisilazane (HMDS) deposited from vapor in a YES HMDS oven at 140° C. This material is consistent with the surface modification layer in Example 2b, of Table 2, above. As shown in FIG. 8, lines 1401 and 1402 indicate some change in surface energy on the carrier. As noted above, this indicates some change in the surface modification layer, and comparatively, Material #4 is somewhat less stable than Material #1. Additionally, the change in surface energy of the carrier for Material #4 is greater than that for any of Materials #2 and #3 indicating, comparatively, that Material #4 is somewhat less stable than Materials #2 and #3. However, as noted by lines 1403 and 1404, the change in surface energy of the carrier is ≤5 mJ/m2, showing that the changes to the surface modification layer did not result in outgassing that affected the surface energy of the cover. However, this is consistent with the manner in which HMDS outgasses. That is, HMDS outgasses ammonia and water which do not affect the surface energy of the cover, and which may not affect some electronics fabrication equipment and/or processing. On the other hand, when the products of the outgassing are trapped between the thin sheet and carrier, there may be other problems, as noted below in connection with the second outgassing test.

Material #5 is Glycidoxypropylsilane, a SAM deposited from 1% toluene solution of glycidoxypropyltriethoxysilane and cured in vacuum oven 30 minutes at 190° C. This is a comparative example material. Although there is relatively little change in the surface energy of the carrier, as shown by lines 1501 and 1502, there is significant change in surface energy of the cover as shown by lines 1503 and 1504. That is, although Material #5 was relatively stable on the carrier surface, it did, indeed outgas a significant amount of material onto the cover surface whereby the cover surface energy changed by $\geq 10$ mJ/m2. Although the surface energy at the end of 10 minutes at 600° C. is within 10 mJ/m2, the change during that time does exceed 10 mJ/m2. See, for example the data points at 1 and 5 minutes. Although not wishing to be bound by theory, the slight uptick in surface energy from 5 minutes to 10 minutes is likely do to some of the outgassed material decomposing and falling off of the cover surface.

Material #6 is DC704 a silicone coating prepared by dispensing 5 ml Dow Corning 704 diffusion pump oil tetramethyltetraphenyl trisiloxane (available from Dow Corning) onto the carrier, placing it on a 500° C. hot plate in air for 8 minutes. Completion of sample preparation is noted by the end of visible smoking. After preparing the sample in the above manner, the outgassing testing described above was carried out. This is a comparative example material. As shown in FIG. 8, lines 1601 and 1602 indicate some change in surface energy on the carrier. As noted above, this indicates some change in the surface modification layer, and comparatively, Material #6 is less stable than Material #1. Additionally, as noted by lines 1603 and 1604, the change in surface energy of the carrier is $\geq 10$ mJ/m2, showing significant outgassing. More particularly, at the test-limit temperature of 450° C., the data point for 10 minutes shows a decrease in surface energy of about 15 mJ/m2, and even greater decrease in surface energy for the points at 1 and 5 minutes. Similarly, the change in surface energy of the cover during cycling at the 600° C. test-limit temperature, the decrease in surface energy of the cover was about 25 mJ/m2 at the 10 minute data point, somewhat more at 5 minutes, and somewhat less at 1 minute. Altogether, though, a significant amount of outgassing was shown for this material over the entire range of testing.

Significantly, for Materials #1-4, the surface energies throughout the time-temperature cycling indicate that the cover surface remains at a surface energy consistent with that of bare glass, i.e., there is collected no material outgassed from the carrier surface. In the case of Material #4, as noted in connection with Table 2, the manner in which the carrier and thin sheet surfaces are prepared makes a big difference in whether an article (thin sheet bonded together with a carrier via a surface modification layer) will survive FPD processing. Thus, although the example of Material #4 shown in FIG. 8 may not outgas, this material may or may not survive the 400° C. or 600° C. tests as noted in connection with the discussion of Table 2.

A second manner of measuring small amounts of outgassing is based on an assembled article, i.e., one in which a thin sheet is bonded to a carrier via a surface modification layer, and uses a change in percent bubble area to determine outgassing. That is, during heating of the article, bubbles formed between the carrier and the thin sheet indicate outgassing of the surface modification layer. As noted above in connection with the first outgassing test, it is difficult to measure outgassing of very thin surface modification layers. In this second test, the outgassing under the thin sheet may be limited by strong adhesion between the thin sheet and carrier. Nonetheless, layers $\leq 10$ nm thick (plasma polymerized materials, SAMs, and pyrolyzed silicone oil surface treatments, for example) may still create bubbles during thermal treatment, despite their smaller absolute mass loss. And the creation of bubbles between the thin sheet and carrier may cause problems with pattern generation, photolithography processing, and/or alignment during device processing onto the thin sheet. Additionally, bubbling at the boundary of the bonded area between the thin sheet and the carrier may cause problems with process fluids from one process contaminating a downstream process. A change in % bubble area of $\geq 5$ is significant, indicative of outgassing, and is not desirable. On the other hand a change in % bubble area of $\leq 1$ is insignificant and an indication that there has been no outgassing.

The average bubble area of bonded thin glass in a class 1000 clean room with manual bonding is 1%. The % bubbles in bonded carriers is a function of cleanliness of the carrier, thin glass sheet, and surface preparation. Because these initial defects act as nucleation sites for bubble growth after heat treatment, any change in bubble area upon heat treatment less than 1% is within the variability of sample preparation. To carry out this test, a commercially available desktop scanner with transparency unit (Epson Expression 10000XL Photo) was used to make a first scan image of the area bonding the thin sheet and carrier immediately after bonding. The parts were scanned using the standard Epson software using 508 dpi (50 micron/pixel) and 24 bit RGB. The image processing software first prepares an image by stitching, as necessary, images of different sections of a sample into a single image and removing scanner artifacts (by using a calibration reference scan performed without a sample in the scanner). The bonded area is then analyzed using standard image processing techniques such as thresholding, hole filling, erosion/dilation, and blob analysis. The newer Epson Expression 11000XL Photo may also be used in a similar manner. In transmission mode, bubbles in the bonding area are visible in the scanned image and a value for bubble area can be determined. Then, the bubble area is compared to the total bonding area (i.e., the total overlap area between the thin sheet and the carrier) to calculate a % area of the bubbles in the bonding area relative to the total bonding area. The samples are then heat treated in a MPT-RTP600s Rapid Thermal Processing system under N2 atmosphere at test-limit temperatures of 300° C., 450° C., and 600° C., for up to 10 minutes. Specifically, the time-temperature cycle carried out included: inserting the article into the heating chamber at room temperature and atmospheric pressure; the chamber was then heated to the test-limit temperature at a rate of 9° C. per minute; the chamber was held at the test-limit temperature for 10 minutes; the chamber was then cooled at furnace rate to 200° C.; the article was removed from the chamber and allowed to cool to room temperature; the article was then scanned a second time with the optical scanner. The % bubble area from the second scan was then calculated as above and compared with the % bubble area from the first scan to determine a change in % bubble area (Δ% bubble area). As noted above, a change in bubble area of $\geq 5$% is significant and an indication of outgassing. A change in % bubble area was selected as the measurement criterion because of the variability in original % bubble area. That is, most surface modification layers have a bubble area of about 2% in the first scan due to handling and cleanliness after the thin sheet and carrier have been prepared and before they are bonded. However, variations may occur between materials. The same Materials #1-6 set forth with respect to the first outgassing test method were again used in this second outgassing test method. Of these materials, Materials #1-4 exhibited about 2% bubble area in the first scan, whereas Materials #5 and #6 showed significantly larger bubble area, i.e., about 4%, in the first scan.

Figure 10:
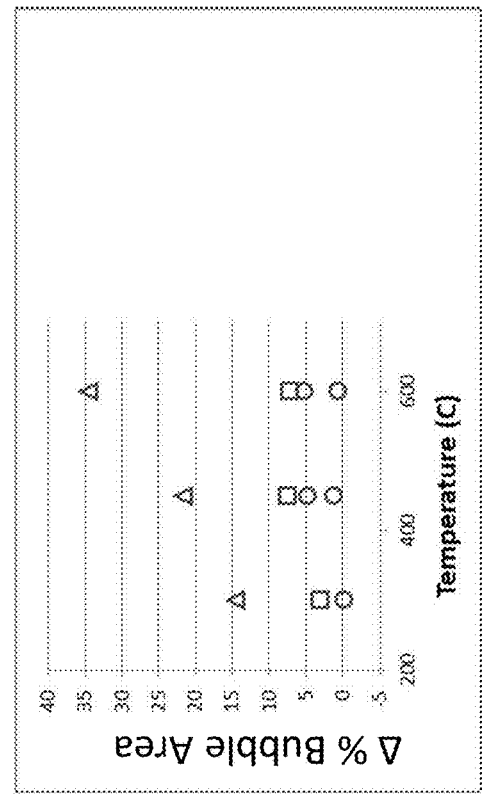
FIG. 10 is another graph of change in % bubble area versus temperature for a variety of materials.

The results of the second outgassing test will be described with reference to FIGS. 9 and 10. The outgassing test results for Materials #1-3 are shown in FIG. 9, whereas the outgassing test results for Materials #4-6 are shown in FIG. 10.

Figure 9:
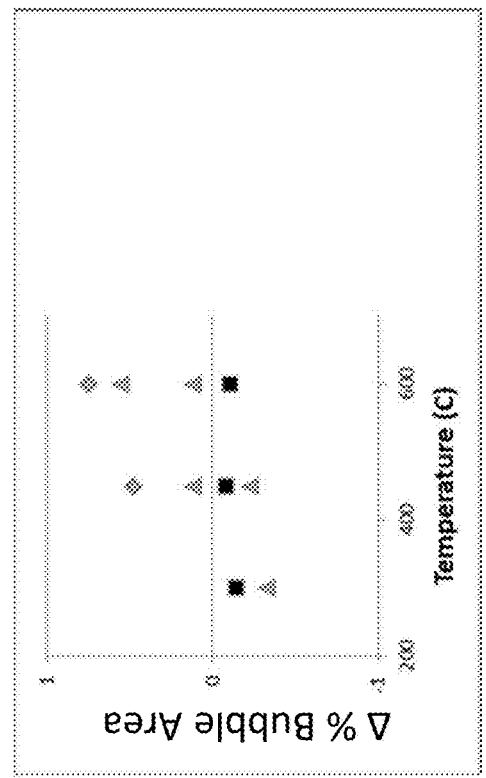
FIG. 9 is a graph of change in % bubble area versus temperature for a variety of materials.

The results for Material #1 are shown as square data points in FIG. 9. As can be seen from the figure, the change in % bubble area was near zero for test-limit temperatures of 300° C., 450° C., and 600° C. Accordingly, Material #1 shows no outgassing at these temperatures.

The results for Material #2 are shown as diamond data points in FIG. 9. As can be seen from the figure, the change in % bubble area is less than 1 for test-limit temperatures of 450° C. and 600° C. Accordingly, Material #2 shows no outgassing at these temperatures.

The results for Material #3 are shown as triangle data points in FIG. 9. As can be seen from the figure, similar to the results for Material #1, the change in % bubble area was near zero for test-limit temperatures of 300° C., 450° C., and 600° C. Accordingly, Material #1 shows no outgassing at these temperatures.

The results for Material #4 are shown as circle data points in FIG. 10. As can be seen from the figure, the change in % bubble area is near zero for the test-limit temperature of 300° C., but is near 1% for some samples at the test-limit temperatures of 450° C. and 600° C., and for other samples of that same material is about 5% at the test limit temperatures of 450° C. and 600° C. The results for Material #4 are very inconsistent, and are dependent upon the manner in which the thin sheet and carrier surfaces are prepared for bonding with the HMDS material. The manner in which the samples perform being dependent upon the manner in which the samples are prepared is consistent with the examples, and associated discussion, of this material set forth in connection with Table 2 above. It was noted that, for this material, the samples having a change in % bubble area near 1%, for the 450° C. and 600° C. test-limit temperatures, did not allow separation of the thin sheet from the carrier according to the separation tests set forth above. That is, a strong adhesion between the thin sheet and carrier may have limited bubble generation. On the other hand, the samples having a change in % bubble area near 5% did allow separation of the thin sheet from the carrier. Thus, the samples that had no outgassing had the undesired result of increased adhesion after temperature treatment which sticking the carrier and thin sheet together (preventing removal of the thin sheet from the carrier), whereas the samples that allowed removal of the thin sheet and carrier had the undesired result of outgassing.

The results for Material #5 are shown in FIG. 10 as triangular data points. As can be seen from the figure, the change in % bubble area is about 15% for the test-limit temperature of 300° C., and is well over that for the higher test-limit temperatures of 450° C. and 600° C. Accordingly, Material #5 shows significant outgassing at these temperatures.

The results for Material #6 are shown as square data points in FIG. 10. As can be seen from this figure, the change in % bubble area is over 2.5% for the test-limit temperature of 300° C., and is over 5% for the test limit-temperatures of 450° C. and 600° C. Accordingly, Material #6 shows significant outgassing at the test-limit temperatures of 450° C. and 600° C.

CONCLUSION

It should be emphasized that the above-described embodiments of the present invention, particularly any "preferred" embodiments, are merely possible examples of implementations, merely set forth for a clear understanding of various principles of the invention. Many variations and modifications may be made to the above-described embodiments of the invention without departing substantially from the spirit and various principles of the invention. All such modifications and variations are intended to be included herein within the scope of this disclosure and the present invention and protected by the following claims.

For example, although the surface modification layer 30 of many embodiments is shown and discussed as being formed on the carrier 10, it may instead, or in addition, be formed on the thin sheet 20. That is, the materials as set forth in the examples 4 and 3 may be applied to the carrier 10, to the thin sheet 20, or to both the carrier 10 and thin sheet 20 on faces that will be bonded together.

Further, although some surface modification layers 30 were described as controlling bonding strength so as to allow the thin sheet 20 to be removed from the carrier 10 even after processing the article 2 at temperatures of 400° C., or of 600° C., of course it is possible to process the article 2 at lower temperatures than those of the specific test the article passed and still achieve the same ability to remove the thin sheet 20 from the carrier 10 without damaging either the thin sheet 20 or the carrier 10.

Still further, although the controlled bonding concepts have been described herein as being used with a carrier and a thin sheet, in certain circumstances they are applicable to controlling bonding between thicker sheets of glass, ceramic, or glass ceramic, wherein it may be desired to detach the sheets (or portions of them) from each other.

Further yet, although the controlled bonding concepts herein have been described as being useful with glass carriers and glass thin sheets, the carrier may be made of other materials, for example, ceramic, glass ceramic, or metal. Similarly, the sheet controllably bonded to the carrier may be made of other materials, for example, ceramic or glass ceramic.

The various above-described concepts according to the present application may be combined with one another in any and all different manners of combination. By way of example, the various concepts may be combined according to the following aspects.

According to a first aspect, there is provided a method of making an electronic device, comprising:
 obtaining a carrier having a carrier bonding surface;
 obtaining a sheet having a sheet bonding surface;
 disposing a surface modification layer on one of the carrier bonding surface and the sheet bonding surface;
 bonding the carrier bonding surface with the sheet bonding surface with the surface modification layer therebetween to form an article, so that the surface energy bonding the sheet to the carrier is of such a character that after subjecting the article to a temperature cycle by heating in an chamber cycled from room temperature to 600° C. at a rate of 9.2° C. per minute, held at a temperature of 600° C. for 10 minutes, and then cooled at 1° C. per minute to 300° C., and then removing the article from the chamber and allowing the article to cool to room temperature, the carrier and sheet do not separate from one another if one is held and the other subjected to the force of gravity, there is no outgassing from the surface modification layer during the temperature cycle, and the sheet may be separated from the carrier without breaking the thinner one of the carrier and the sheet into two or more pieces;

disposing an electronic-device component onto the sheet.

According to a second aspect, there is provided a method of making an electronic device, comprising:
obtaining a glass article, the glass article comprising:
a carrier having a carrier bonding surface;
a sheet having a sheet bonding surface;
a surface modification layer disposed on one of the carrier bonding surface and the sheet bonding surface,
the carrier bonding surface being bonded with the sheet bonding surface with the surface modification layer therebetween, wherein the surface energy bonding the sheet to the carrier is of such a character that after subjecting the article to a temperature cycle by heating in an chamber cycled from room temperature to 600° C. at a rate of 9.2° C. per minute, held at a temperature of 600° C. for 10 minutes, and then cooled at 1° C. per minute to 300° C., and then removing the article from the chamber and allowing the article to cool to room temperature, the carrier and sheet do not separate from one another if one is held and the other subjected to the force of gravity, there is no outgassing from the surface modification layer during the temperature cycle, and the sheet may be separated from the carrier without breaking the thinner one of the carrier and the sheet into two or more pieces;
disposing an electronic-device component onto the sheet.

According to a third aspect, there is provided the method of aspect 1 or aspect 2, wherein the electronic device component comprises an organic light emitting material.

According to a fourth aspect, there is provided the method of any one of aspects 1 to 3, wherein processing the electronic device includes processing at a temperature ≥400° C.

According to a fifth aspect, there is provided the method of any one of aspects 1 to 3, wherein processing the electronic device includes processing at a temperature ≥600° C.

According to a sixth aspect, there is provided the method of any one of aspects 1 to 5, further comprising dicing the carrier and sheet into two separate portions.

According to a seventh aspect, there is provided the method of aspect 6, wherein at least one of the separate portions includes a sheet portion remaining bonded to a carrier portion.

According to an eighth aspect, there is provided the method of aspect 6 or aspect 7, further comprising further processing of the at least one of the separate portions with an additional electronic-device component.

According to a ninth aspect, there is provided the method of any one of aspects 1 to 8, further comprising removing at least one part of the sheet from the carrier, wherein the at least one part of the sheet includes the electronic device component thereon.

According to a tenth aspect, there is provided the method of any one of aspects 1 to 9, wherein the carrier comprises glass.

According to an eleventh aspect, there is provided the method of any one of aspects 1-10, wherein the carrier without any surface modification layer has an average surface roughness Ra of ≤2 nm.

According to a twelfth aspect, there is provided the method of any one of aspects 1-11, wherein the carrier has a thickness of 200 microns to 3 mm.

According to a thirteenth aspect, there is provided the method of any one of aspects 1-12, wherein the sheet comprises glass.

According to a fourteenth aspect, there is provided the method of any one of aspects 1-13, wherein the sheet without any surface modification layer has an average surface roughness Ra of ≤2 nm.

According to a fifteenth aspect, there is provided the method of any one of aspects 1 to 14, wherein the sheet has a thickness of ≤300 microns.

According to a sixteenth aspect, there is provided the method of any one of aspects 1 to 15, wherein the surface modification layer has a thickness of from 0.1 to 100 nm.

According to a seventeenth aspect, there is provided the method of any one of aspects 1 to 15, wherein the surface modification layer has a thickness of from 0.1 to 10 nm.

According to an eighteenth aspect, there is provided the method of any one of aspects 1 to 15, wherein the surface modification layer has a thickness of from 0.1 to 2 nm According to a nineteenth aspect, there is provided the method of any one of aspects 1 to 18, wherein each of the carrier and the sheet is of a size 100 mm×100 mm or larger.

According to a twentieth aspect, there is provided the method of any one of aspects 1 to 19, wherein the surface modification layer comprises one of:
a) a plasma polymerized fluoropolymer; and
b) an aromatic silane.

According to a twenty first aspect, there is provided the method of aspect 20, wherein when the surface modification layer comprises a plasma polymerized fluoropolymer, the surface modification layer is one of: plasma polymerized polytetrafluroethylene; and a plasma polymerized fluoropolymer surface modification layer deposited from a CF4-C4F8 mixture having ≤40% C4F8.

According to a twenty second aspect, there is provided the method of aspect 20, wherein when the surface modification layer comprises an aromatic silane, the surface modification layer is one of: phenyltriethoxysilane; diphenyldiethoxysilane; and 4-pentafluorophenyltriethoxysilane.

According to a twenty third aspect, there is provided the method of aspect 20, wherein when the surface modification layer comprises an aromatic silane, the surface modification layer contains chlorophenyl, or fluorophenyl, silyl groups.

What is claimed is:

1. A method of making an electronic device, comprising:
obtaining a carrier having a carrier bonding surface;
obtaining a sheet having a sheet bonding surface, the sheet comprising glass;
disposing a surface modification layer on one of the carrier bonding surface and the sheet bonding surface, wherein the surface modification layer comprises one of:
a) a plasma polymerized fluoropolymer; and
b) an aromatic silane;
bonding the carrier bonding surface with the sheet bonding surface with the surface modification layer therebetween to form an article, the surface modification layer being in contact with both the carrier bonding surface and the sheet bonding surface, so that the surface energy bonding the sheet to the carrier is of such a character that after subjecting the article to a temperature cycle by heating in an chamber cycled from room temperature to 600° C. at a rate of 9.2° C. per minute, held at a temperature of 600° C. for 10 minutes, and then cooled at 1° C. per minute to 300° C., and then removing the article from the chamber and allowing the article to cool to room temperature, the carrier and sheet do not separate from one another if one is held and the other subjected to the force of gravity, there is no outgassing from the surface modification layer during the temperature cycle, and the sheet may be separated from the carrier without breaking the thinner one of the carrier and the sheet into two or more pieces, wherein the carrier and the sheet have different thicknesses;

disposing an electronic-device component onto the sheet.

2. The method of claim 1, adhesion energy between the carrier and the sheet is greater than about 24 mJ/m$^2$.

3. The method of claim 1, adhesion energy between the carrier and the sheet is from 50 to 1000 mJ/m$^2$.

4. A method of making an electronic device, comprising:
obtaining an article; the article comprising:
  a carrier having a carrier bonding surface;
  a sheet having a sheet bonding surface, the sheet comprising glass;
  a surface modification layer disposed on one of the carrier bonding surface and the sheet bonding surface; wherein the surface modification layer comprises one of:
    a) a plasma polymerized fluoropolymer; and
    b) an aromatic silane,
  the carrier bonding surface being bonded with the sheet bonding surface with the surface modification layer therebetween, the surface modification layer being in contact with both the carrier bonding surface and the sheet bonding surface, wherein the surface energy bonding the sheet to the carrier is of such a character that after subjecting the article to a temperature cycle by heating in an chamber cycled from room temperature to 600° C. at a rate of 9.2° C. per minute, held at a temperature of 600° C. for 10 minutes, and then cooled at 1° C. per minute to 300° C., and then removing the article from the chamber and allowing the article to cool to room temperature, the carrier and sheet do not separate from one another if one is held and the other subjected to the force of gravity, there is no outgassing from the surface modification layer during the temperature cycle, and the sheet may be separated from the carrier without breaking the thinner one of the carrier and the sheet into two or more pieces, wherein the carrier and the sheet have different thicknesses;

disposing an electronic-device component onto the sheet.

5. The method of claim 4, wherein the electronic device component comprises an organic light emitting material.

6. The method of claim 4, wherein the disposing of the electronic-device component onto the sheet includes processing at a temperature ≥400° C.

7. The method of claim 4, further comprising dicing the carrier and sheet into two separate portions.

8. The method of claim 7, wherein at least one of the separate portions includes a sheet portion remaining bonded to a carrier portion.

9. The method of claim 7, further comprising further processing of the at least one of the separate portions with an additional electronic-device component.

10. The method of claim 4, further comprising removing at least one part of the sheet from the carrier, wherein the at least one part of the sheet includes the electronic device component thereon.

11. The method of claim 4, wherein the carrier comprises glass.

12. The method of claim 4, wherein the carrier without any surface modification layer has an average surface roughness Ra of ≤2 nm.

13. The method of claim 4, wherein the carrier has a thickness of 200 microns to 3 mm.

14. The method of claim 4, wherein the sheet is glass.

15. The method of claim 4, wherein the sheet without any surface modification layer has an average surface roughness Ra of ≤2 nm.

16. The method of claim 4, wherein the sheet has a thickness of ≤300 microns.

17. The method of claim 4, wherein the surface modification layer has a thickness of from 0.1 to 100 nm.

18. The method of claim 4, wherein each of the carrier and the sheet is of a size 100 mm×100 mm or larger.

19. The method of claim 4, wherein the surface modification layer comprises a plasma polymerized fluoropolymer, and the surface modification layer is one of: plasma polymerized polytetrafluroethylene; and a plasma polymerized fluoropolymer surface modification layer deposited from a CF4-C4F8 mixture having ≤40% C4F8.

20. The method of claim 4, wherein the surface modification layer comprises an aromatic silane, and the surface modification layer is one of: phenyltriethoxysilane; diphenyldiethoxysilane; and 4-pentafluorophenyltriethoxysilane.

21. The method of claim 4, wherein the surface modification layer comprises an aromatic silane, and the surface modification layer contains chlorophenyl, or fluorophenyl, silyl groups.

22. The method of claim 4, adhesion energy between the carrier and the sheet is greater than about 24 mJ/m$^2$.

23. The method of claim 4, adhesion energy between the carrier and the sheet is from 50 to 1000 mJ/m2.

* * * * *

UNITED STATES PATENT AND TRADEMARK OFFICE
CERTIFICATE OF CORRECTION

PATENT NO. : 10,014,177 B2
APPLICATION NO. : 14/047514
DATED : July 3, 2018
INVENTOR(S) : Robert Alan Bellman et al.

It is certified that error appears in the above-identified patent and that said Letters Patent is hereby corrected as shown below:

On the Title Page

On page 3, Column 2, item (56), U.S. Patent Documents, Line 50, delete "9222604" and insert -- 1992022604 --, therefor.

On page 4, Column 1, item (56), other publications, Line 43, delete "Ehanced" and insert -- Enhanced --, therefor.

On page 4, Column 2, item (56), other publications, Line 4, delete "perflurorelastomer" and insert -- perfluoroelastomer --, therefor.

In the Claims

In Column 36, Line 40, Claim 19, delete "polytetrafluroethylene;" and insert -- polytetrafluoroethylene; --, therefor.

Signed and Sealed this
Nineteenth Day of May, 2020

Andrei Iancu
*Director of the United States Patent and Trademark Office*